United States Patent
Lou et al.

(10) Patent No.: US 11,953,518 B2
(45) Date of Patent: Apr. 9, 2024

(54) SWITCHING MATRIX SYSTEM AND OPERATING METHOD THEREOF FOR SEMICONDUCTOR CHARACTERISTIC MEASUREMENT

(71) Applicant: STAR TECHNOLOGIES, INC., Hsinchu (TW)

(72) Inventors: Choon Leong Lou, Hsinchu (TW); Hsiao Hui Hsieh, Hsinchu (TW); Li Min Wang, Hsinchu (TW)

(73) Assignee: STAR TECHNOLOGIES, INC., Hsinchu (TW)

( * ) Notice: Subject to any disclaimer, the term of this patent is extended or adjusted under 35 U.S.C. 154(b) by 607 days.

(21) Appl. No.: 17/137,808

(22) Filed: Dec. 30, 2020

(65) Prior Publication Data

US 2022/0206040 A1 Jun. 30, 2022

(51) Int. Cl.
*G01R 1/02* (2006.01)
*G01R 31/26* (2020.01)
*G06N 3/045* (2023.01)

(52) U.S. Cl.
CPC ......... *G01R 1/025* (2013.01); *G01R 31/2601* (2013.01)

(58) Field of Classification Search
CPC . G06N 3/045; G06N 3/04; H04J 11/00; H04J 11/0069
See application file for complete search history.

(56) References Cited

U.S. PATENT DOCUMENTS

| | | | | |
|---|---|---|---|---|
| 6,611,853 | B2 * | 8/2003 | Graafmans | G01R 31/31907 700/298 |
| 6,981,086 | B2 * | 12/2005 | Wetzel | G01D 21/00 710/301 |
| 7,865,326 | B2 * | 1/2011 | Johnson | G01D 11/24 710/301 |
| 2002/0173869 | A1 | 11/2002 | Graafmans | |
| 2003/0078748 | A1 | 4/2003 | Ayadi | |
| 2006/0116167 | A1 * | 6/2006 | Raviv | G07F 17/329 455/558 |
| 2010/0231254 | A1 | 9/2010 | Lou et al. | |
| 2014/0278177 | A1 | 9/2014 | Nguyen et al. | |

(Continued)

FOREIGN PATENT DOCUMENTS

| JP | 2009097980 A | 5/2009 |
|---|---|---|
| JP | 2009097980 A | 5/2009 |

(Continued)

OTHER PUBLICATIONS

Office Action dated Sep. 6, 2022 in JP Application No. 2021-124250, 5 pages (w/English-translation).

*Primary Examiner* — Jermele M Hollington
*Assistant Examiner* — Temilade S Rhodes-Vivour
(74) *Attorney, Agent, or Firm* — Muncy, Geissler, Olds & Lowe, P.C.

(57) ABSTRACT

The present disclosure provides a switching matrix system and an operating method thereof for semiconductor characteristic measurement. The switching matrix system is configured to: detect an assembly of at least one switching matrix module inserted into a plurality of slots of the switching matrix system; determine a user interface according to the assembly of the at least one switching matrix module inserted into the slots, wherein the user interface includes an operable object corresponding to the assembly; and provide the user interface.

20 Claims, 25 Drawing Sheets

(56) References Cited

U.S. PATENT DOCUMENTS

2015/0186093 A1\* 7/2015 Kim ..................... G06F 1/1677
  345/174
2018/0313889 A1 11/2018 Su et al.

FOREIGN PATENT DOCUMENTS

| JP | 2016510899 A | 4/2016 |
| KR | 1020070018078 A | 2/2007 |
| TW | 201033623 A1 | 9/2010 |
| TW | 201907174 A | 2/2019 |

\* cited by examiner

SWITCHING MATRIX SYSTEM AND OPERATING METHOD THEREOF FOR SEMICONDUCTOR CHARACTERISTIC MEASUREMENT

TECHNICAL FIELD

The present disclosure relates to a switching matrix system and an operating method thereof for semiconductor characteristic measurement, and more particularly, to a modularized switching matrix system and an operating method thereof for semiconductor characteristic measurement.

DISCUSSION OF THE BACKGROUND

During production of semiconductor devices, semiconductor characteristic measurement is necessary for testing electrical and functional characteristics of newly-completed semiconductor devices at the wafer level to check whether the semiconductor devices meet product specifications. To date, a variety of apparatuses have been developed for testing the semiconductor devices. However, the structures of the existing apparatuses for testing the semiconductor devices are inconvenient to use.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a switching matrix system for semiconductor characteristic measurement. The switching matrix system includes a plurality of slots, a controller and a storage unit. The plurality of slots are configured for receiving and electrical connecting at least one switching matrix module. The controller is electrically connected to the slots. The storage unit is electrically connected to the controller for storing a program that, when executed, causes the controller to: detect an assembly of the at least one switching matrix module inserted into the slots; determine a user interface according to the assembly of the at least one switching matrix module inserted into the slots, wherein the user interface includes at least one operable object corresponding to the assembly; and provide the user interface.

In some embodiments, the switching matrix system further includes a board for connecting the slots and the controller. The board, for example, is a printed circuit board.

In some embodiments, the program, when executed, further causes the controller to detect a switching matrix module type for each of the at least one switching matrix modules. Determining the user interface further includes: determining the user interface according to the switching matrix module type of each of the at least one switching matrix module and the assembly of the at least one switching matrix module inserted into the slots.

In some embodiments, the at least one switching matrix module includes a plurality of switching matrix modules, and the switching matrix system further includes a backplane for connecting the plurality of switching matrix modules.

In some embodiments, the switching matrix system further includes a backplane for connecting the plurality of slots.

In some embodiments, the at least one operable object includes one operable object corresponding to the switching matrix modules.

In some embodiments, the at least one operable object includes a plurality of operable objects corresponding to the switching matrix modules respectively.

In some embodiments, the at least one switching matrix module includes a plurality of switching matrix modules, and the switching matrix system further includes a first backplane and a second backplane. The first backplane is for connecting a first portion of the switching matrix modules. The second backplane is for connecting a second portion of the switching matrix modules.

In some embodiments, the switching matrix system further includes a first backplane and a second backplane. The first backplane is for connecting a first portion of the slots. The second backplane is for connecting a second portion of the slots.

In some embodiments, the at least one operable object includes: a first operable object corresponding to the first portion of the switching matrix modules; and a second operable object corresponding to the second portion of the switching matrix modules.

In some embodiments, the at least one operable object includes: a first operable object corresponding to the first portion of the switching matrix modules; and a plurality of second operable objects corresponding to the second portion of the switching matrix modules, respectively.

In some embodiments, the at least one operable object includes: a plurality of first operable objects corresponding to the first portion of the switching matrix modules, respectively; and a plurality of second operable objects corresponding to the second portion of the switching matrix modules, respectively.

In some embodiments, the switching matrix system further includes a display for displaying the user interface.

In some embodiments, the display includes a touch panel for operating the at least one operable object of the user interface.

Another aspect of the present disclosure provides an operating method of a switching matrix system. The operating method includes: detecting, by the switching matrix system, an assembly of at least one switching matrix module inserted into a plurality of slots of the switching matrix system; determining, by the switching matrix system, a user interface according to the assembly of the at least one switching matrix module inserted into the slots, wherein the user interface includes an operable object corresponding to the assembly; and providing, by the switching matrix system, the user interface.

In some embodiments, the operating method further includes: detecting, by the switching matrix system, a switching matrix module type for each of the at least one switching matrix module. Determining the user interface further includes: determining, by the switching matrix system, the user interface according to the switching matrix module type of each of the at least one switching matrix module and the assembly of the at least one switching matrix module inserted into the slots.

In some embodiments, the at least one switching matrix module includes a plurality of switching matrix modules, and the at least one operable object includes one operable object corresponding to the switching matrix modules.

In some embodiments, the at least one switching matrix module includes a plurality of switching matrix modules, and the at least one operable object includes a plurality of operable objects corresponding to the switching matrix modules, respectively.

In some embodiments, the at least one switching matrix module includes a plurality of switching matrix modules, and the at least one operable object includes: a first operable object corresponding to a first portion of the switching matrix modules; and a second operable object corresponding to a second portion of the switching matrix modules.

In some embodiments, the at least one switching matrix module includes a plurality of switching matrix modules, and the at least one operable object includes: a first operable object corresponding to a first portion of the switching matrix modules; and a plurality of second operable objects corresponding to a second portion of the switching matrix modules.

In some embodiments, the at least one switching matrix module includes a plurality of switching matrix modules, and the at least one operable object includes: a plurality of first operable objects corresponding to a first portion of the switching matrix modules, respectively; and a plurality of second operable objects corresponding to a second portion of the switching matrix modules, respectively.

In some embodiments, providing the user interface further includes: displaying, by the switching matrix system, the user interface on a display.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1A:
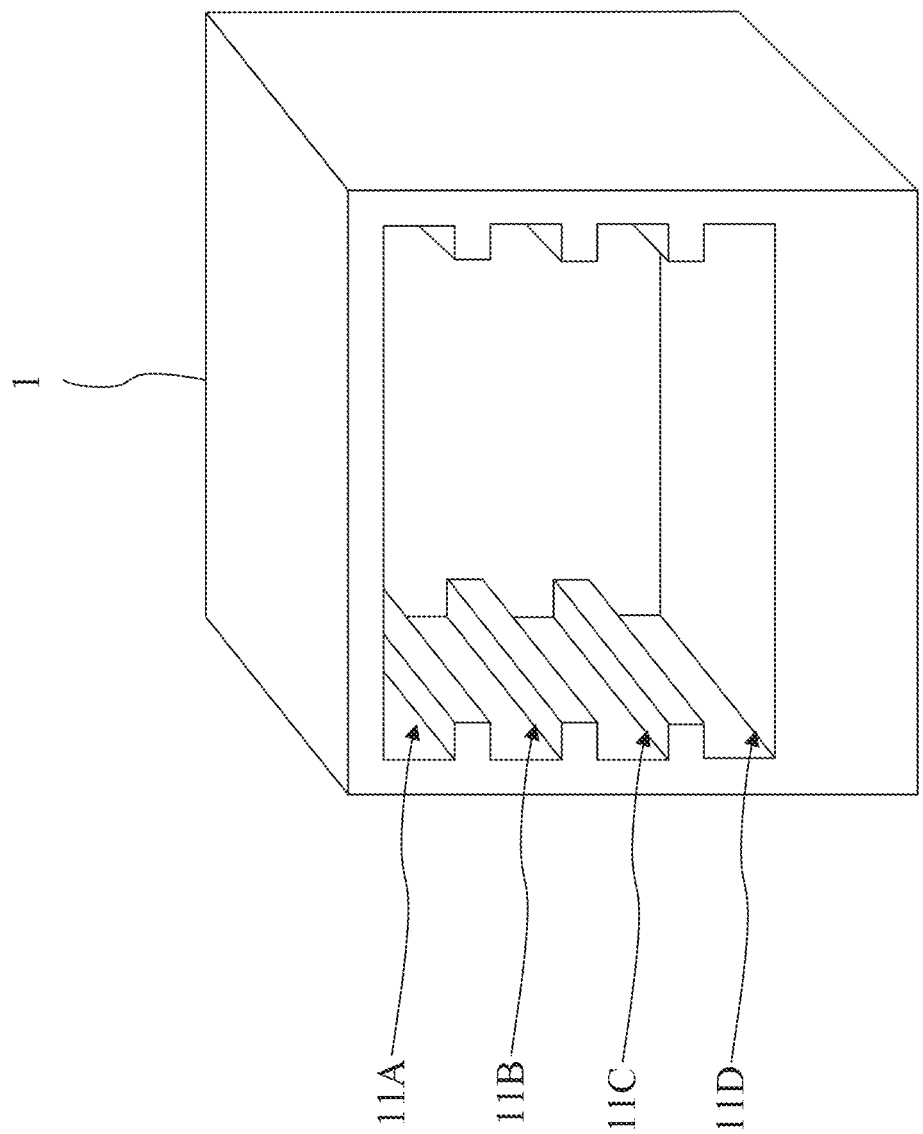
FIG. 1A is a schematic view of a switching matrix system for semiconductor characteristic measurement according to some embodiments of the present disclosure.
Figure 1B:
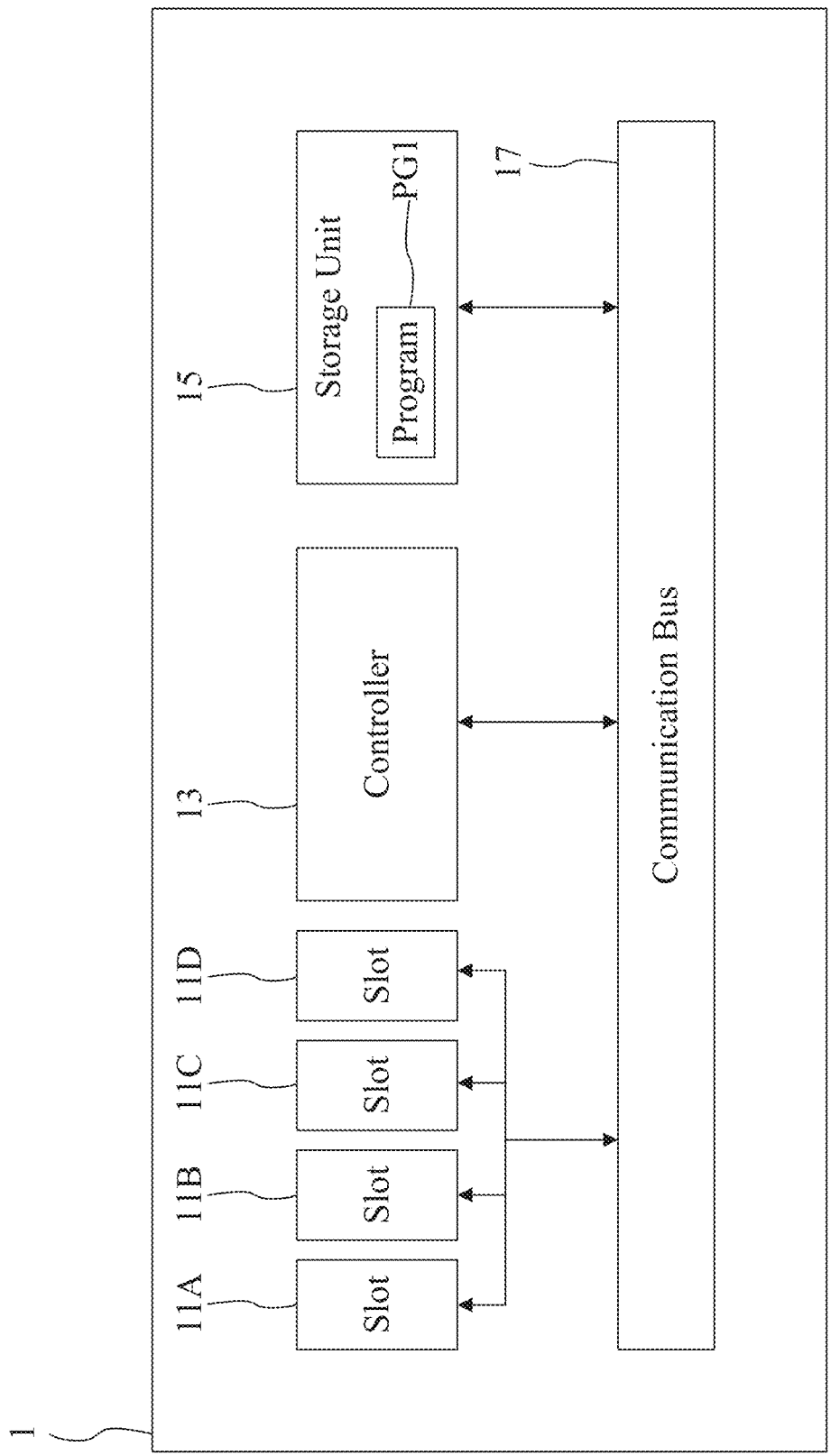
FIG. 1B is a block diagram of a switching matrix system according to some embodiments of the present disclosure.

Please refer to FIGS. 1A and 1B together. FIG. 1A is a schematic view of a switching matrix system 1 for semiconductor characteristic measurement according to some embodiments of the present disclosure. FIG. 1B is a block diagram of the switching matrix system 1 according to some embodiments of the present disclosure.

The switching matrix system 1 may include a plurality of slots 11A to 11D, a controller 13 and a storage unit 15. The slots 11A to 11D may be used for receiving at least one switching matrix module. The controller 13, the slots 11A to 11D and the storage unit 15 may be electrically connected through a communication bus 17.

The communication bus 17 may allow the controller 13 to execute a program PG1 stored in the storage unit 15. When executed, the program PG1 may generate one or more interrupts (e.g., a software-interrupt) to cause the controller 13 to perform functions of the program PG1 for operating the switching matrix system 1. The interactions between the switching matrix system 1 and the functions of the program PG1 will be further described below.

Figure 1C:
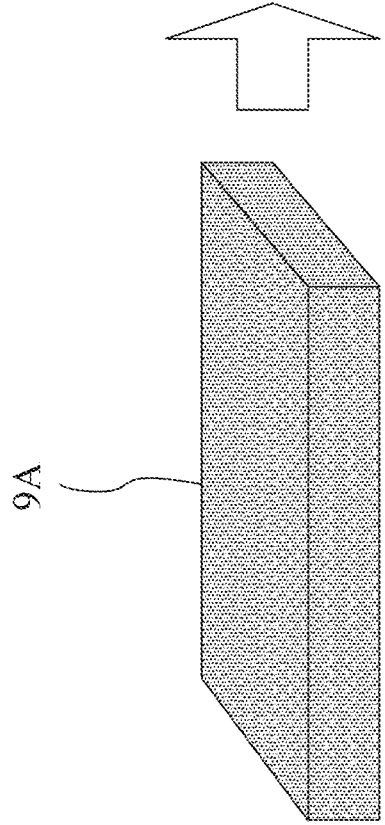
FIG. 1C is a schematic view of a switching matrix module being inserted into a switching matrix system according to some embodiments of the present disclosure.
Figure 1C:
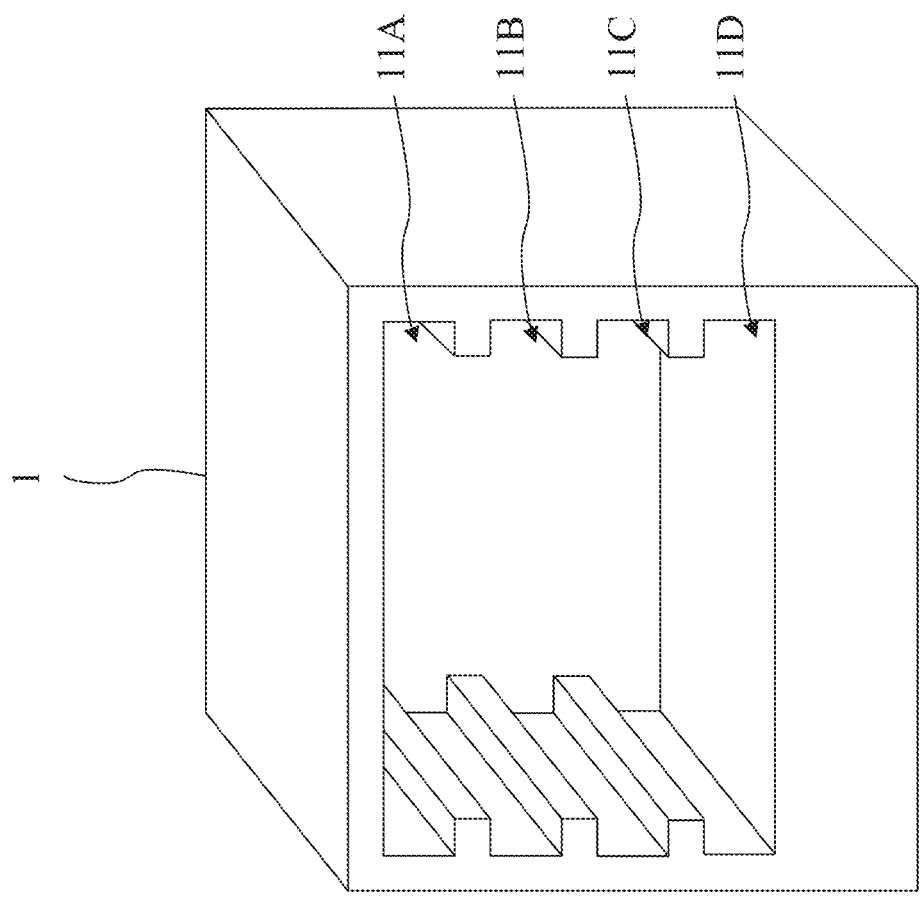
Figure 1D:
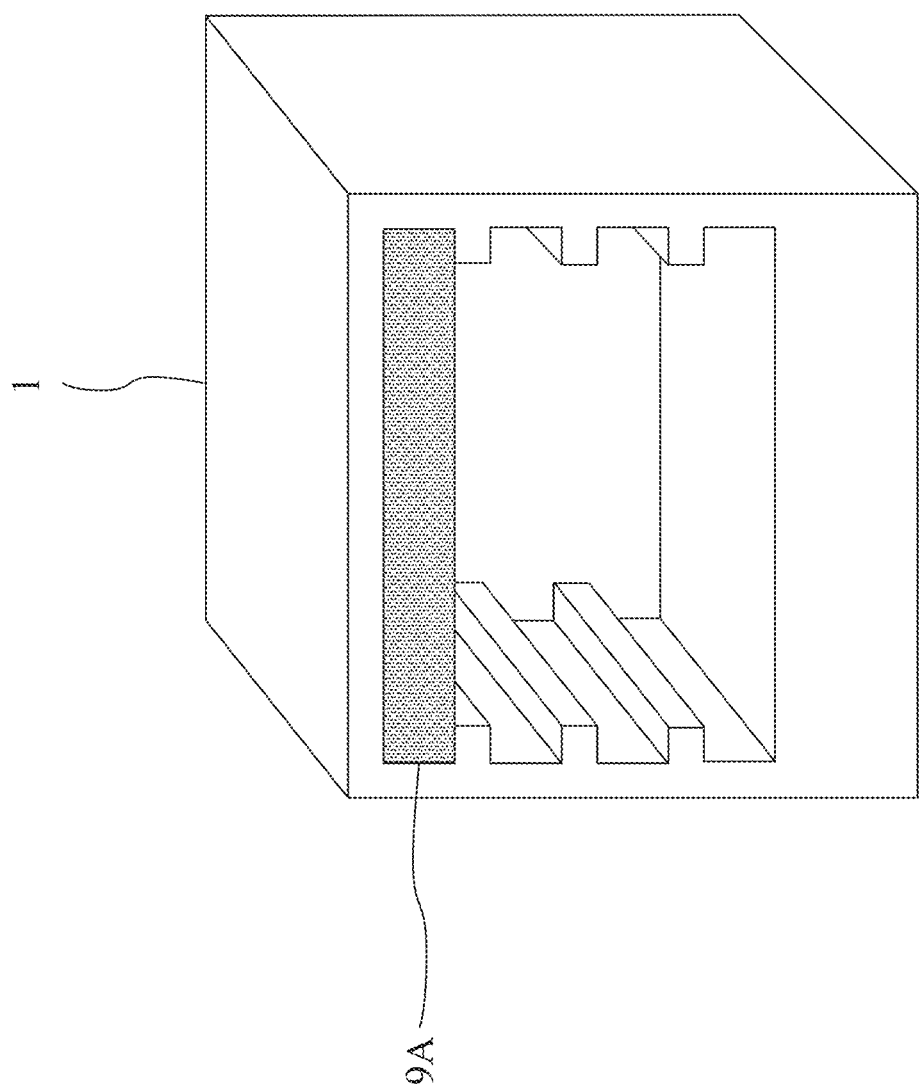
FIG. 1D is a schematic view of an assembly of a switching matrix module and a switching matrix system according to some embodiments of the present disclosure.

Please refer to FIGS. 1C and 1D together. FIG. 1C is a schematic view of a switching matrix module being inserted into the switching matrix system 1 according to some embodiments of the present disclosure. FIG. 1D is a schematic view of an assembly of the switching matrix module and the switching matrix system 1 according to some embodiments of the present disclosure.

In detail, a switching matrix module 9A may be provided. The switching matrix module 9A may have a size that fits one slot of the switching matrix system 1. Accordingly, the switching matrix module 9A may be inserted into one slot of the switching matrix system.

In some implementations, the switching matrix module 9A may be inserted into the slot 11A of the switching matrix system 1 as shown in FIGS. 1C and 1D. After being inserted into the slot 11A of the switching matrix system 1, the switching matrix module 9A may be electrically connected to the controller 13 of the switching matrix system 1.

Next, after the switching matrix system 1 is booted up, the controller 13 of the switching matrix system 1 may detect an w assembly of a switching matrix module inserted into the slots 11A to 11D. Particularly, in these implementations, the controller 13 of the switching matrix system 1 may detect the insertion of the switching matrix module 9A. Then, the controller 13 of the switching matrix system 1 may determine the assembly of the is switching matrix module 9A by a hardware configuration (not shown).

Next, the controller 13 of the switching matrix system 1 may determine a user interface (e.g., a graphical user interface) GUI10 according to the assembly of the switching matrix module 9A inserted into the slot 11A, and may provide the user interface GUI10 for a user to operate the switching matrix module 9A.

Figure 1E:
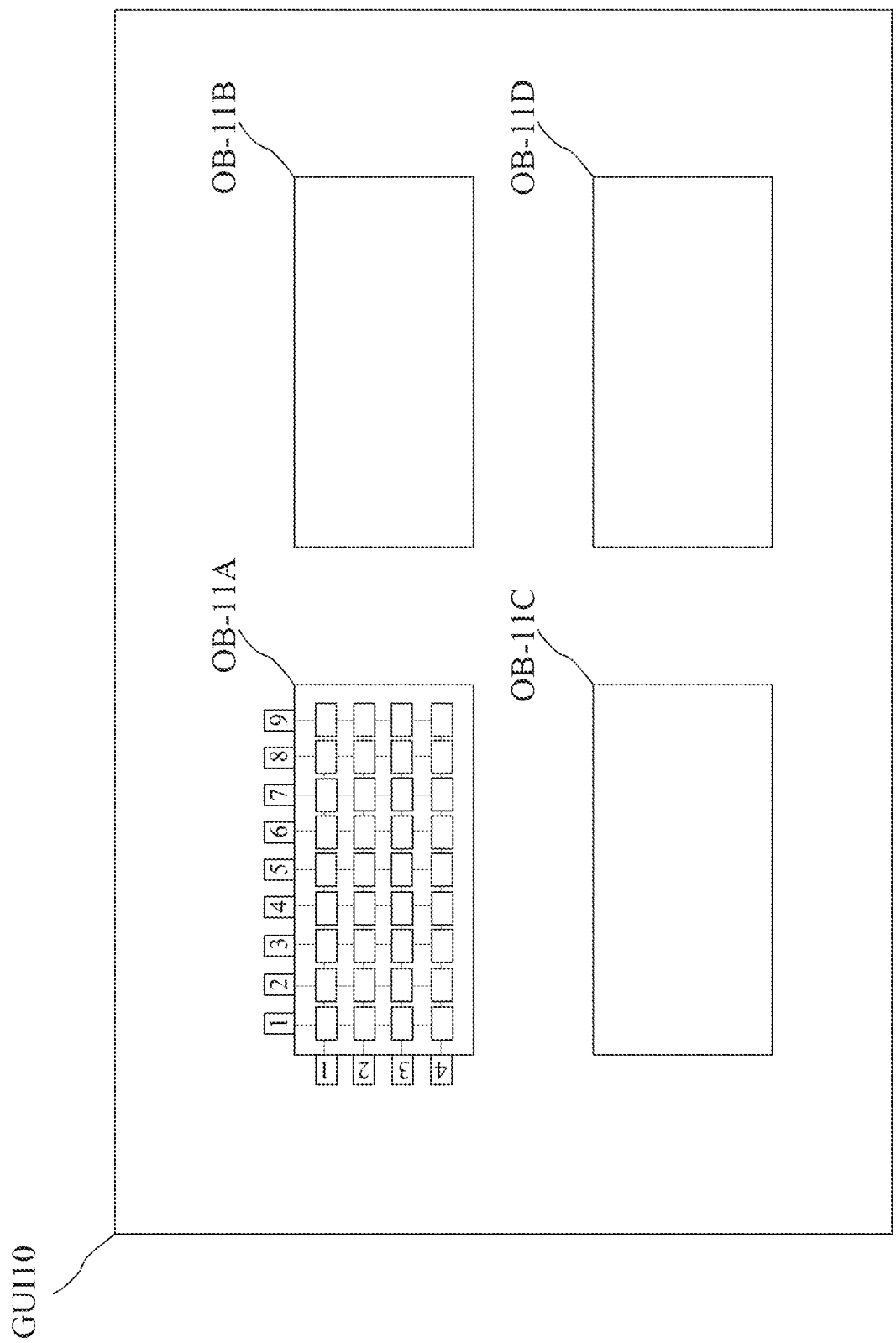
FIG. 1E is a schematic view of a user interface according to some embodiments of the present disclosure.

Please refer to FIG. 1E, which is a schematic view of the user interface GUI10 according to some embodiments of the present disclosure. The user interface GUI10 may include objects OB-11A to OB-11D corresponding to the slots 11A to 11D, respectively.

Based on the assembly, only the slot 11A receives the switching matrix module 9A. Accordingly, the object OB-11A of the user interface GUI10 determined by the controller 13 may include a graphic matrix corresponding to a physical matrix of the switching matrix module 9A, such that the user may operate the graphic matrix of the object OB-11A to control the physical matrix of the switching matrix module 9A. In other words, the object OB-11A may be an operable object of the switching matrix module 9A.

More specifically, elements of the graphic matrix of the object OB-11A may correspond to elements of the physical matrix of the switching matrix module 9A. When the user operates one element of the graphic matrix of the object OB-11A, the corresponding element of the physical matrix of the switching matrix module 9A may be controlled accordingly.

For example, when the user operates the element [4, 1] of the graphic matrix of the object OB-11A to be under an open status, the corresponding element [4, 1] of the physical matrix of the switching matrix module 9A is opened accordingly. When the user operates the element [1, 7] of the graphic matrix of the object OB-11A to be under a closing status, the corresponding element [1, 7] of the physical matrix of the switching matrix module 9A is closed accordingly.

On the other hand, because the slots 11B to 11D do not receive at least one switching matrix module (i.e., the slots 11B to 11D are non-occupied), the corresponding objects OB-11B to OB-11D may be blank, as shown in FIG.

Figure 1F:
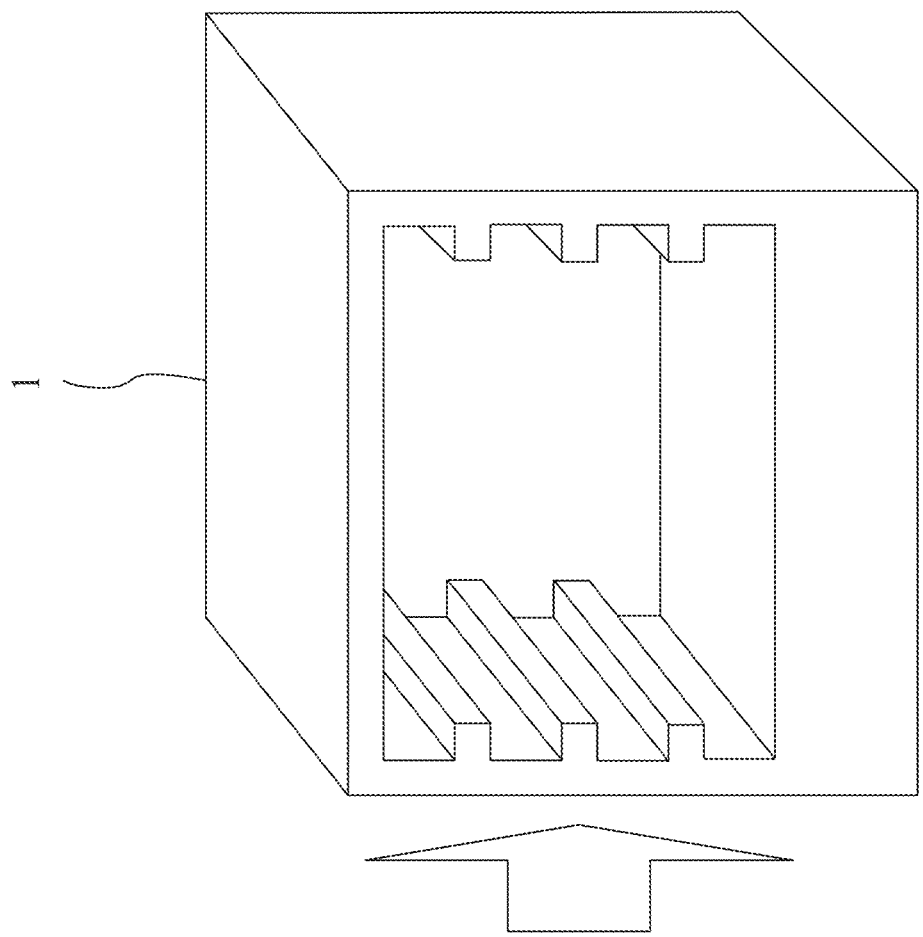
FIG. 1F is a schematic view of a switching matrix module being inserted into a switching matrix system according to some embodiments of the present disclosure.
Figure 1F:
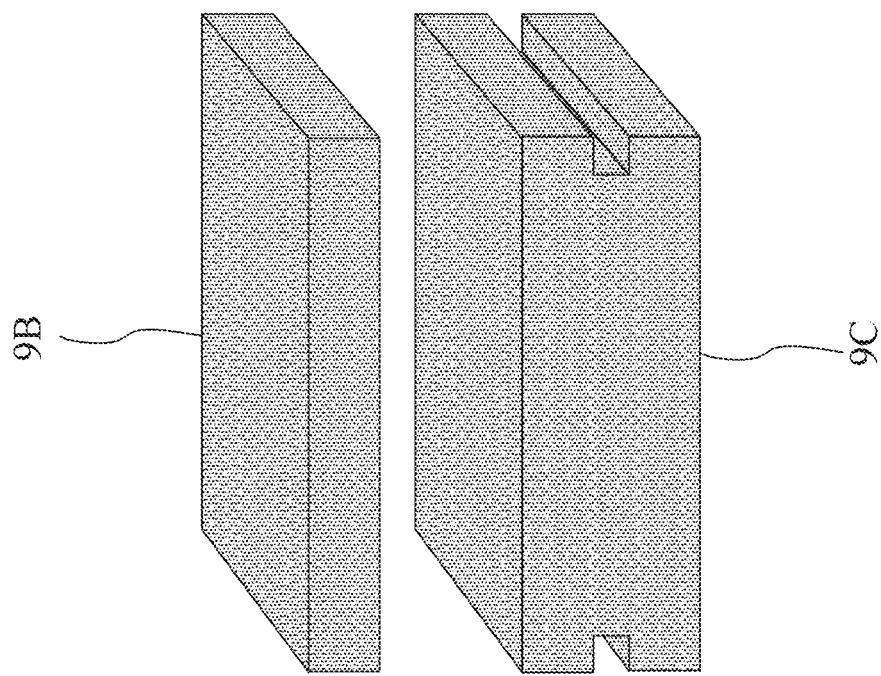
Figure 1G:
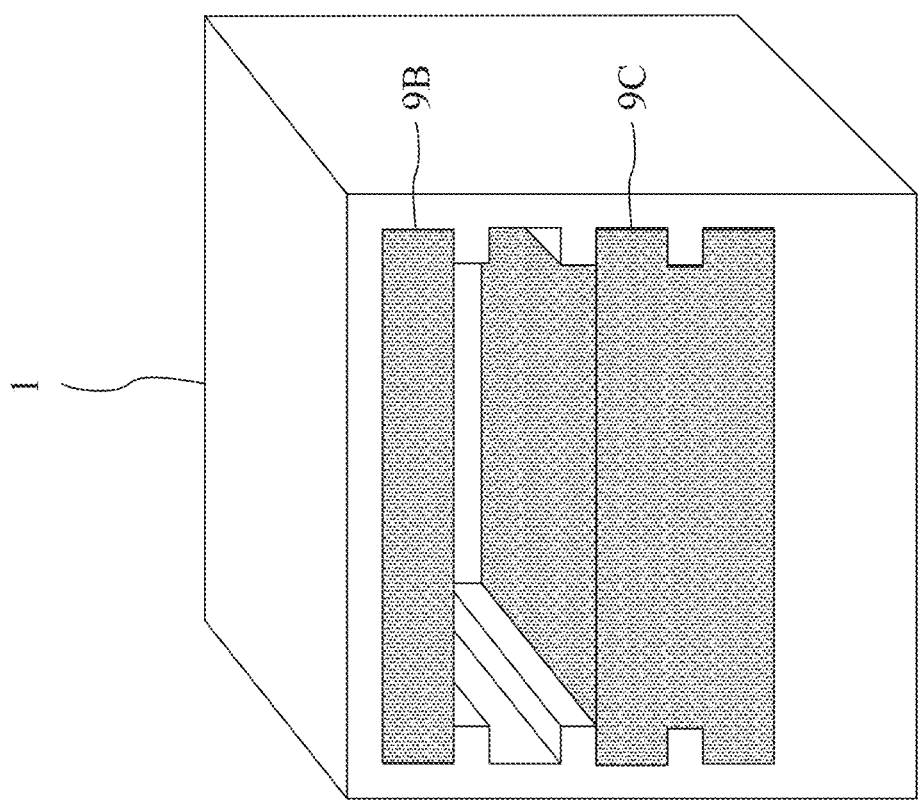
FIG. 1G is a schematic view of an assembly of a switching matrix module and a switching matrix system according to some embodiments of the present disclosure.

Please refer to FIGS. 1F and 1G together. FIG. 1F is a schematic view of switching matrix modules being inserted into the switching matrix system 1 according to some embodiments of the present disclosure. FIG. 1G is a schematic view of an assembly of switching matrix modules and the switching matrix system 1 according to some embodiments of the present disclosure.

In detail, switching matrix modules 9B and 9C may be provided. The switching matrix module 9B may have a size that fits one slot of the switching matrix system 1. The switching matrix module 9C may have a size that fits two slots of the switching matrix system 1. Accordingly, the switching matrix module 9B may be inserted into one slot of the switching matrix system 1 and the switching matrix module 9C may be inserted into two slots of the switching matrix system 1.

In some implementations, as shown in FIGS. 1F and 1G, the switching matrix module 9B may be inserted into the slot 11A of the switching matrix system 1, and the switching matrix module 9C may be inserted into the slots 11C and 11D of the switching matrix system 1. After being inserted into the slots 11A, 11C and 11D of the switching matrix system 1, the switching matrix modules 9B and 9C may be electrically connected to the controller 13 of the switching matrix system 1.

Next, after the switching matrix system 1 is booted up, the controller 13 of the switching matrix system 1 may detect an assembly of switching matrix modules inserted into the slots 11A, 11.0 and 11D. Particularly, in such implementations, the controller 13 of the switching matrix system 1 may detect the insertions of the switching matrix module 9B and 9C. Then, the controller 13 of the switching matrix system 1 may determine the assembly of: (1) the switching matrix module 9B; and (2) the switching matrix module 9C by the hardware configuration.

Next, the controller 13 of the switching matrix system 1 may determine a user interface GUI11 according to the assembly of (I) the switching matrix module 9B inserted in the slot H A; and (2) the switching matrix module 9C inserted in the slots 11C and 11D. The controller 13 may provide the user interface GUM for user to operate the switching matrix modules 9B and 9C.

Figure 1H:
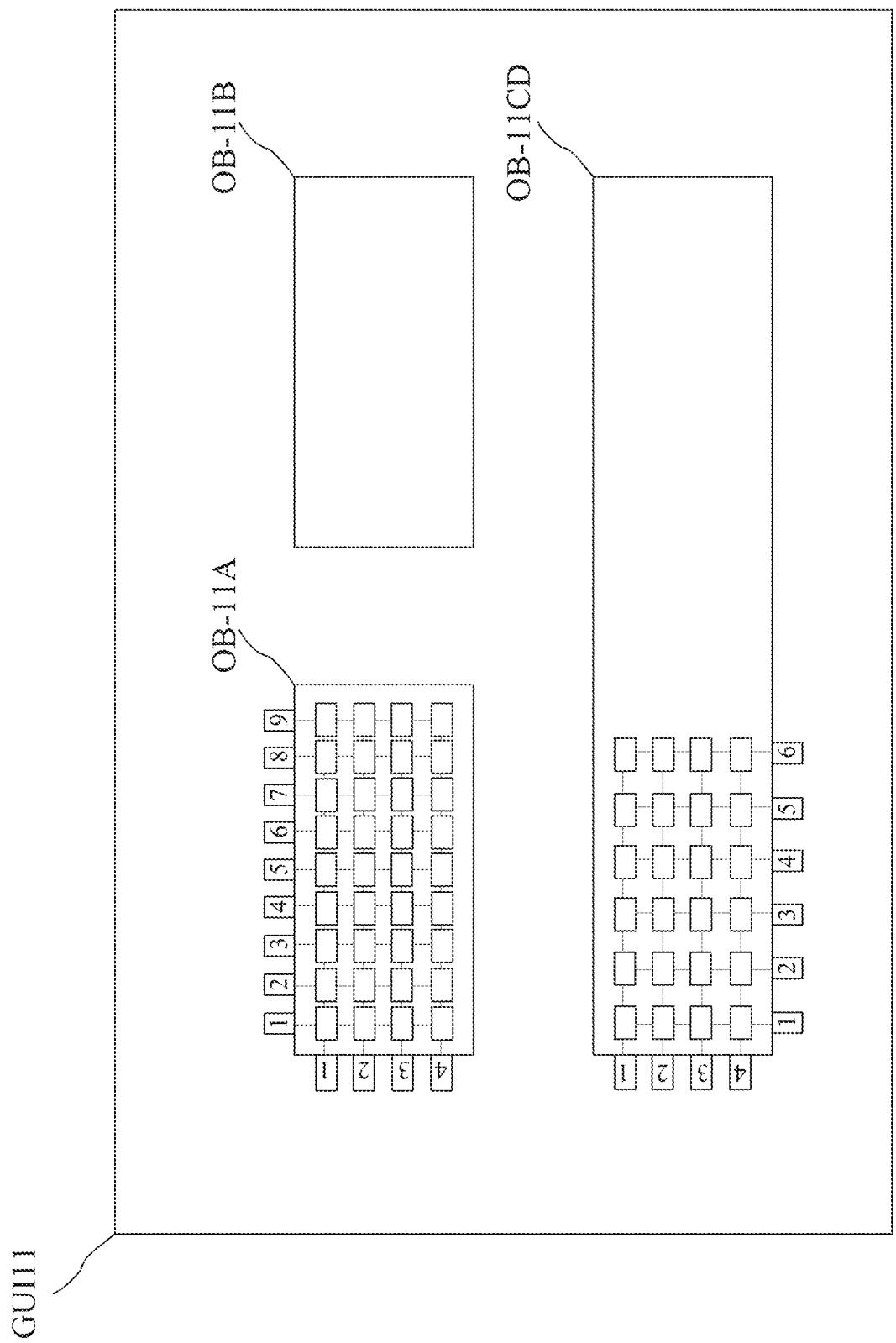
FIG. 1H is a schematic view of a user interface according to some embodiments of the present disclosure.

Please refer to FIG. 1H, which is a schematic view of the user interface GUI11 according to some embodiments of the present disclosure. The user interface GUI11 may include objects OB-11A, OB-11B and OB-11CD corresponding to the slots 11A, 11B and a combination of slots 11C and 11D, respectively.

Based on the assembly, the slot 11A receives the switching matrix module 9B. Accordingly, the object OB-11A of the user interface GUM determined by the controller 13 may include a graphic matrix corresponding to a physical matrix of the switching matrix module 9B so that the user may operate the graphic matrix of the object OB-11A to control the physical matrix of the switching matrix module 9B. In other words, the object OB-11A may be an operable object of the switching matrix module 9B.

More specifically, elements of the graphic matrix of the object OB-11A may correspond to elements of the physical matrix of the switching matrix module 9B. When the user operates one element of the graphic matrix of the object OB-11A, the corresponding element of the physical matrix of the switching matrix module 9B may be controlled accordingly.

For example, when the user operates the element [1, 1] of the graphic matrix of the object OB-11A to be under an open status, the corresponding element [1, 1] of the physical matrix of the switching matrix module 9B is opened accordingly. When the user operates the element [2, 1] of the graphic matrix of the object OB-11A to be under a closing status, the corresponding element [2, 1] of the physical matrix of the switching matrix module 9B is closed accordingly.

Further, based on the assembly, the slots 11C and 11D receive the switching matrix module 9C. Accordingly, the object OB-11CD of the user interface GUM determined by the controller 13 may include a graphic matrix corresponding to a physical matrix of the switching matrix module 9C so that the user may operate the graphic matrix of the object OB-11CD to control the physical matrix of the switching matrix module 9C. In other words, the object OB-11CD may be an operable object of the switching matrix module 9C.

More specifically, elements of the graphic matrix of the object OB-11CD may correspond to elements of the physical matrix of the switching matrix module 9C. When the user operates one element of the graphic matrix of the object OB-11CD, the corresponding element of the physical matrix of the switching matrix module 9C may be controlled accordingly.

For example, when the user operates the element [3, 1] of the graphic matrix of the object OB-11CD to be under an open status, the corresponding element [3, 1] of the physical matrix of the switching matrix module 9C is opened accordingly. When the user operates the element [2, 6] of the graphic matrix of the object OB-11CD to be under a closing status, the corresponding element [2, 6] of the physical matrix of the switching matrix module 9C is closed accordingly.

On the other hand, because the slot 11B do not receives the switching matrix module (i.e., the slot 11B is non-occupied), the corresponding object OB-11B may be blank, as shown in FIG. 1H.

Figure 2A:
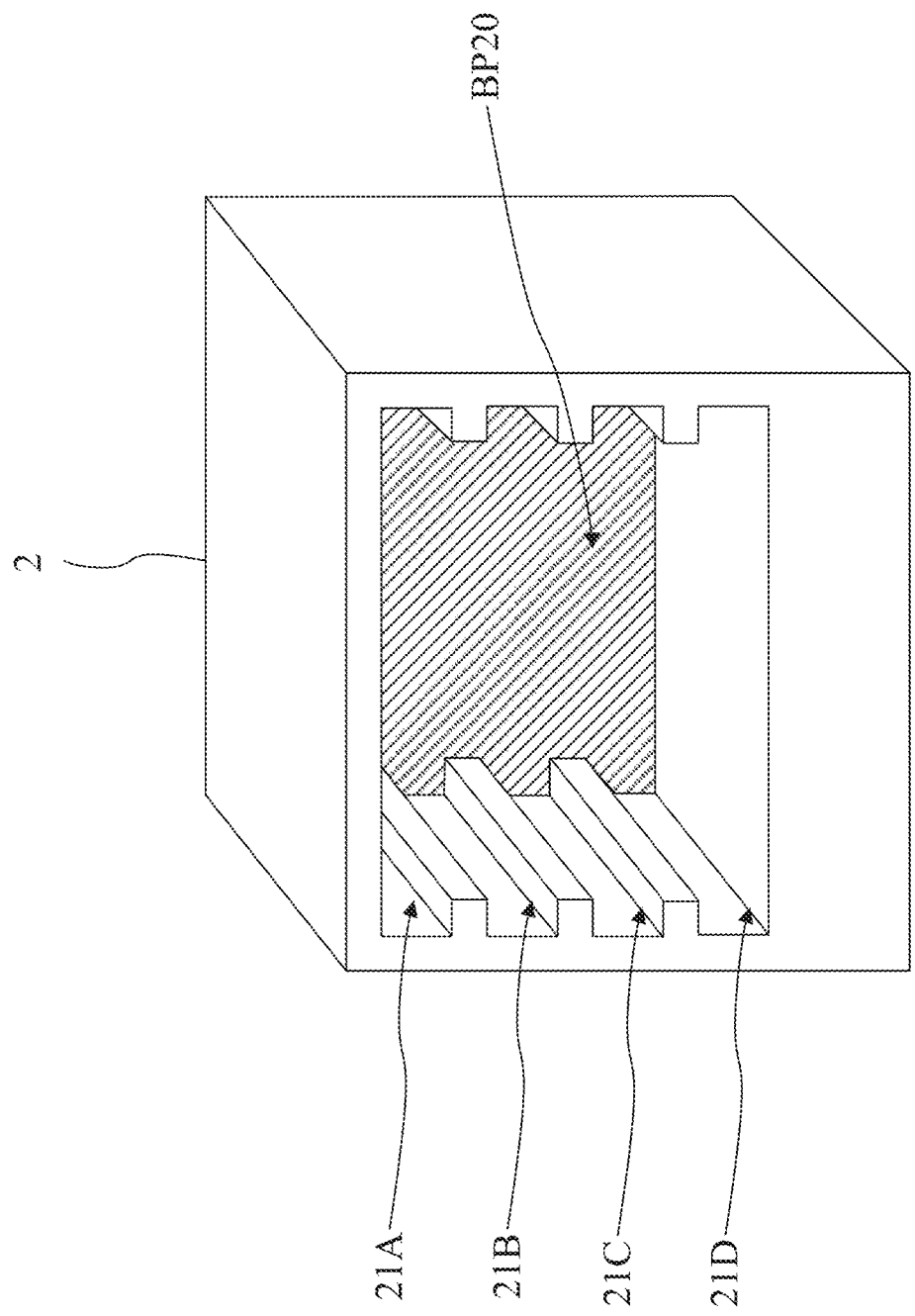
FIG. 2A is a schematic view of a switching matrix system for semiconductor characteristic measurement according to some embodiments of the present disclosure.
Figure 2B:
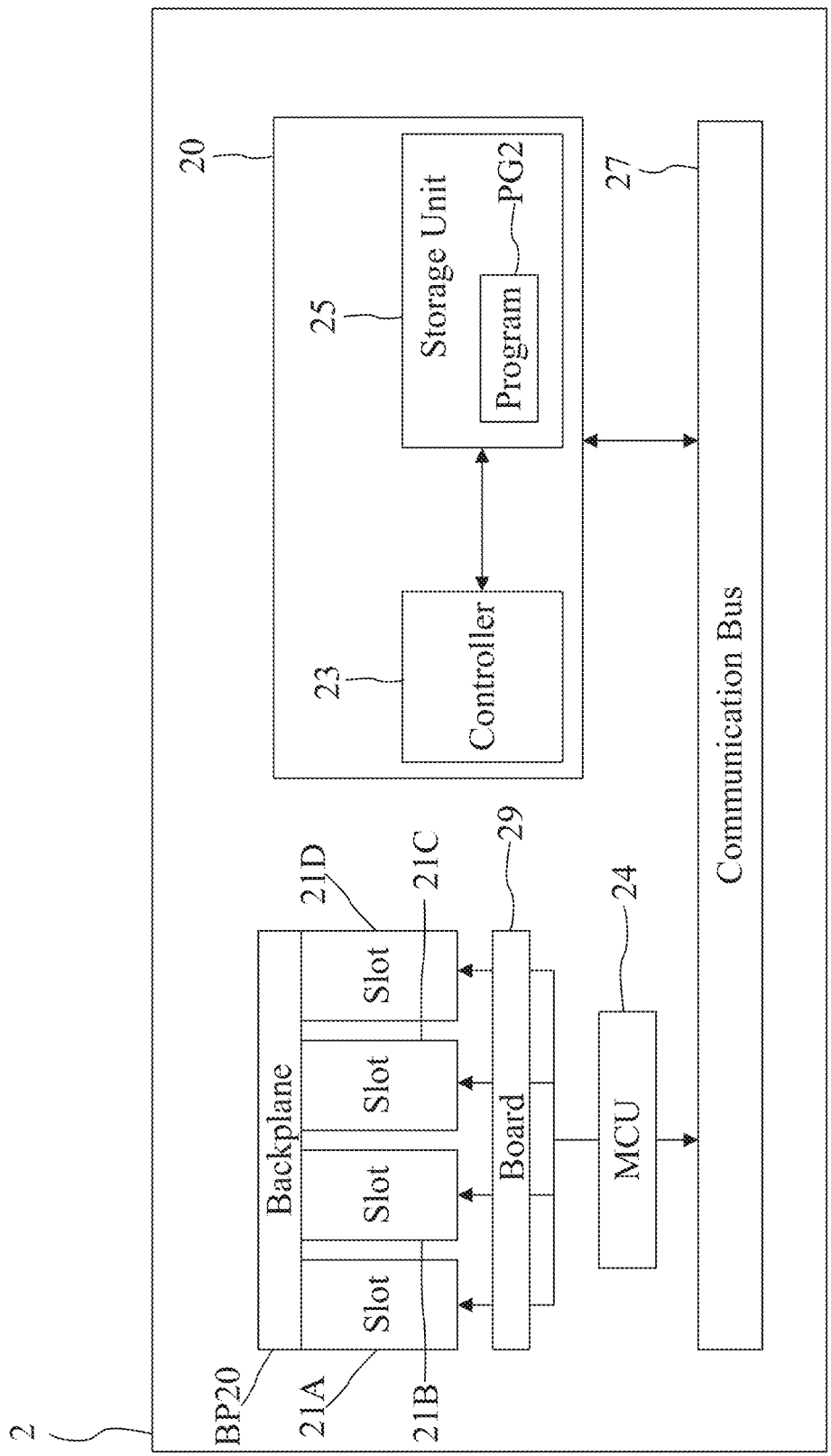
FIG. 2B is a block diagram of a switching matrix system according to some embodiments of the present disclosure.

Please refer to FIGS. 2A and 2B together. FIG. 2A is a schematic view of a switching matrix system 2 for semiconductor characteristic measurement, such as the characteristics of digital, analog, mixed mode or RF, according to some embodiments of the present disclosure. FIG. 2B is a block diagram of the switching matrix system 2 according to some embodiments of the present disclosure.

The switching matrix system 2 may include a computing device 20, a plurality of slots 21A to 21D, a micro controller unit (MCU) 24, a board 29 and a backplane BP20. The computing device 20 may include a controller 23 and a storage unit 25. The controller 23 and the storage unit 25 may be electrically connected through a communication bus (not shown) of the computing device 20.

The slots 21A to 21D may be used for receiving at least one switching matrix module. The slots 21A to 21D and the MCU 24 may be electrically connected by the board 29, and the slots 21A to 21D may be integrated by the backplane BP20.

The computing device 20, the MCU 24 and the slots 21A to 21D may be electrically connected through a communication bus 27. The computing device 20 may exchange control signals with the MCU 24 through the communication bus 27 for interacting with the slots 21A to 21D.

The computing device 20 may allow the controller 23 to execute a program PG2 stored in the storage unit 25. The program PG2 may be executed after starting an operating mode of the switching matrix system 2. Further, when executed, the program PG2 may generate one or more interrupts (e.g., software-interrupts) to cause the controller 23 to perform functions of the program PG2 for operating the switching matrix system 2. The interactions between the switching matrix system 2 and the functions of the program PG2 will be further described below.

Figure 2C:
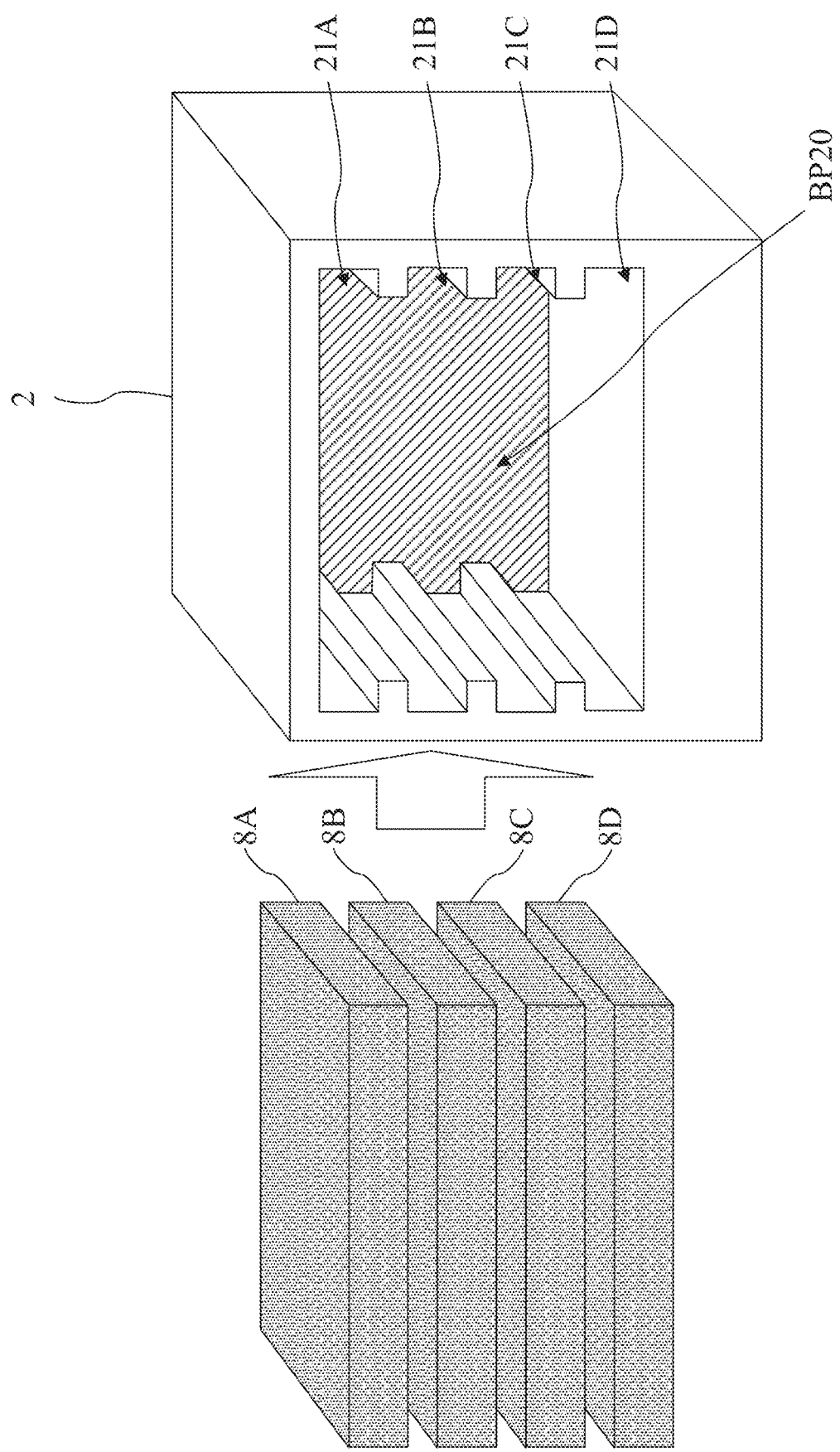
FIG. 2C is a schematic view of a switching matrix module being inserted into a switching matrix system according to some embodiments of the present disclosure.
Figure 2D:
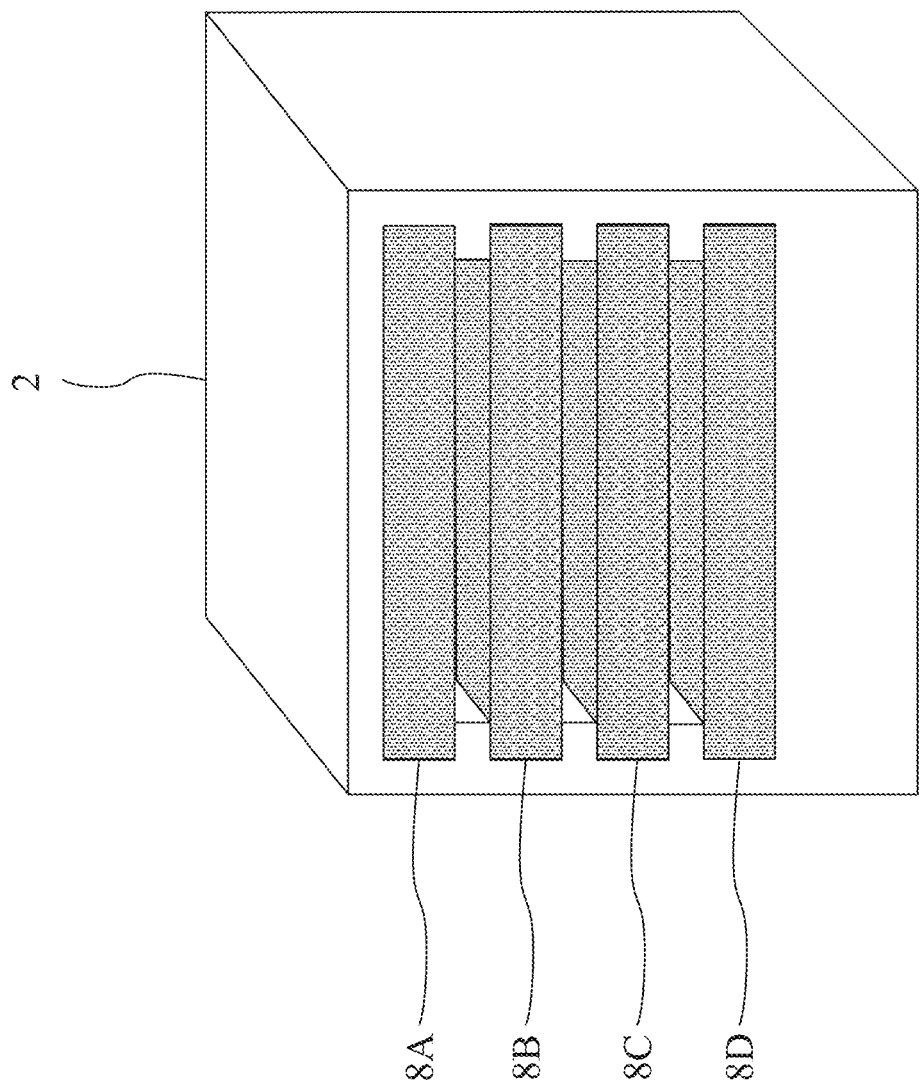
FIG. 2D is a schematic view of an assembly of a switching matrix module and a switching matrix system according to some embodiments of the present disclosure.

Please refer to FIGS. 2C and 2D together. FIG. 2C is a schematic view of switching matrix modules being inserted into the switching matrix system 2 according to some embodiments of the present disclosure. FIG. 2D is a schematic view of an assembly of switching matrix modules and the switching matrix system 2 according to some embodiments of the present disclosure.

In detail, switching matrix modules 8A to 8D may be provided. Each of the switching matrix modules 8A to 8D may have a size that fits one slot of the switching matrix system 2. Accordingly, each of the switching matrix modules 8A to 8D may be inserted into one slot of the switching matrix system 2.

In these embodiments, the switching matrix modules 8A to 8D may be respectively inserted into the slots 21A to 21D of the switching matrix system 2, as shown in FIGS. 2C and 2D. After being inserted into the slots 21A to 21D of the switching matrix system 2, the switching matrix modules 8A to 8D may be electrically connected to the MCU 24 of the switching matrix system 2.

Next, after the switching matrix system 2 is booted up, the operating mode starts. The program PG2 may then be executed to initialize a hardware setting of the switching matrix system 2 and to perform some dangle procedures for security of the switching matrix system 2.

Subsequently, through the MCU 24, the controller 23 may detect an assembly of switching matrix modules inserted into the slots 21A to 2D. Particularly, in such implementations, the controller 23 of the switching matrix system 2 may detect the insertions of the switching matrix modules 8A to 8D. Then, the controller 23 of the switching matrix system 2 may determine the assembly of the switching matrix modules 8A to 8D by a hardware configuration (not shown).

Further, through the MCU 24, the controller 23 of the switching matrix system 2 may determine a switching matrix module type for each of the switching matrix modules 8A to 8D. Each switching matrix module type may include matrix size information (e.g., number of channels of the matrix) of the corresponding switching matrix module.

In some embodiments, when the backplane BP20 is configured for operating the switching matrix modules 8A to 8D individually, the controller 23 of the switching matrix system 2 may determine a user interface GUI20 according to: (1) the switching matrix module types of the switching matrix modules 8A to 8D; and (2) the assembly of the switching matrix modules 8A to 8D inserted into the slots 21A to 21D. The controller 23 of the switching matrix system 2 may provide the user interface GUI20 for a user to operate the switching matrix modules 8A to 8D.

Figure 2E:
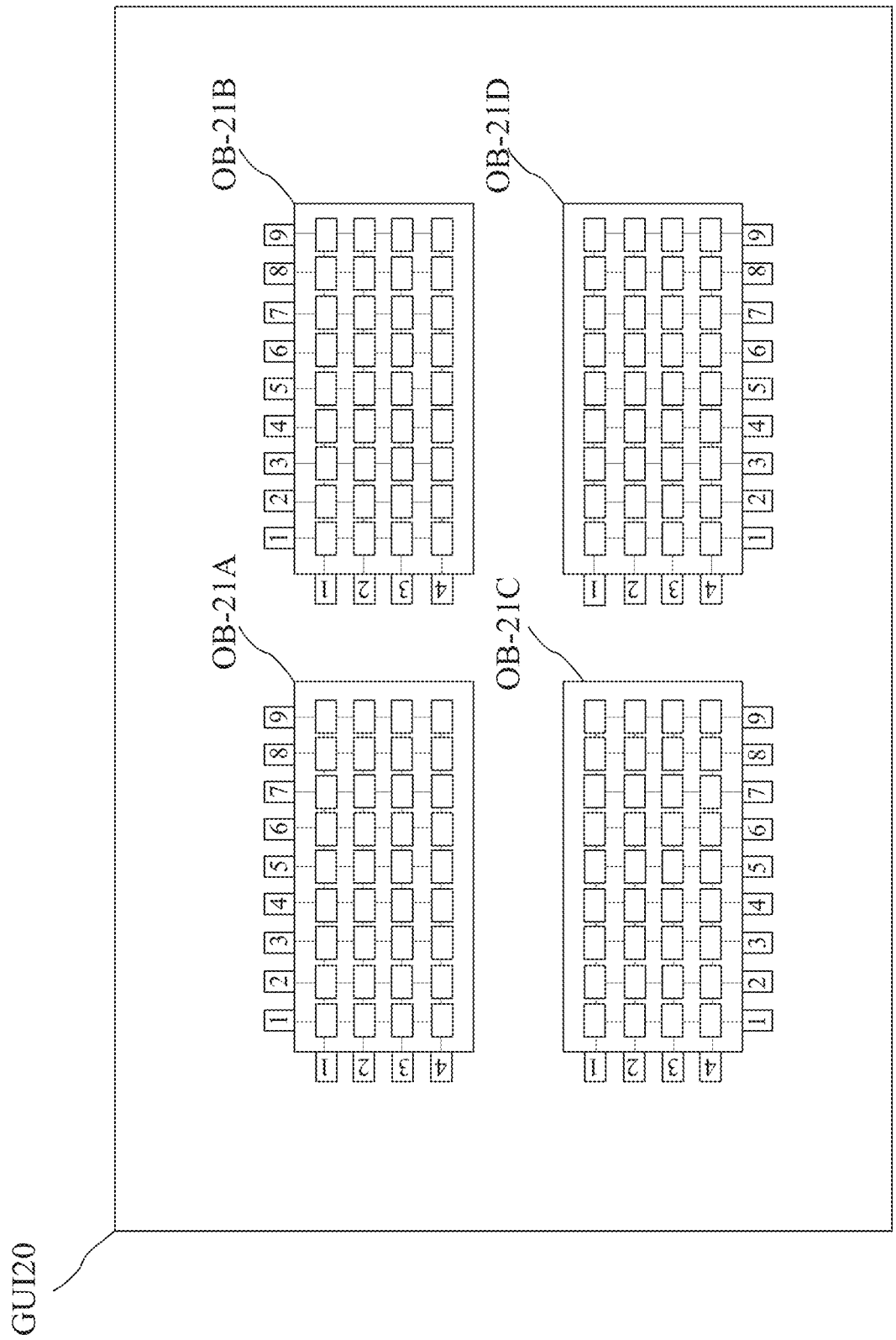
FIG. 2E is a schematic view of a user interface according to some embodiments of the present disclosure.

Please refer to FIG. 2E, which is a schematic view of the user interface GUI20 according to some embodiments of the present disclosure. The user interface GUI20 may include objects OB-21A to OB-21D corresponding to the slots 21A to 21D, respectively.

Based on the assembly, the slots 2A to 21D respectively receive the switching matrix modules 8A to 8D. Accordingly, the objects OB-21A to OB-21D of the user interface GUI20 determined by the controller 23 may include graphic matrixes corresponding to physical matrixes of the switching matrix modules 8A to 8D, such that the user may operate the graphic matrixes of the objects OB-21A to OB-21D to control the physical matrixes of the switching matrix modules SA to 8D. In other words, the objects OB-21A to OB-21D may be operable objects of the switching matrix modules 8A to 8D.

More specifically, elements of the graphic matrix of the object OB-21A may correspond to elements of the physical matrix of the switching matrix module 8A. When the user operates one element of the graphic matrix of the object OB-21A, the corresponding element of the physical matrix of the switching matrix module 8A may be controlled accordingly.

Similarly, elements of the graphic matrix of the object OB-21B may correspond to elements of the physical matrix of the switching matrix module 8B. When the user operates one element of the graphic matrix of the object OB-21B, the corresponding element of the physical matrix of the switching matrix module 8B may be controlled accordingly.

Similarly, elements of the graphic matrix of the object OB-21C may correspond to elements of the physical matrix of the switching matrix module 8C. When the user operates one element of the graphic matrix of the object OB-21C, the corresponding element of the physical matrix of the switching matrix module 8C may be controlled accordingly.

Similarly, elements of the graphic matrix of the object OB-21D may correspond to elements of the physical matrix of the switching matrix module 81D. When the user operates one element of the graphic matrix of the object OB-21D, the corresponding element of the physical matrix of the switching matrix module 8D may be controlled accordingly.

For example, when the user operates the element [3, 1] of the graphic matrix of the object OB-21C to be under an open status, the corresponding element [3, 1] of the physical matrix of the switching matrix module 8C is opened accordingly. When the user operates the element [2, 2] of the graphic matrix of the object OB-21A to be under a closing status, the corresponding element [2, 2] of the physical matrix of the switching matrix module 8A is closed accordingly.

In some embodiments, when the backplane BP20 is configured for operating the switching matrix modules 8A to 8D as one module, the controller 23 of the switching matrix system 2 may determine a user interface GUI21 according to: (1) the switching matrix module types of the switching matrix modules 8A to 8D; and (2) the assembly of the switching matrix modules 8A to 8D inserted into the slots 21A to 21D. The controller 23 of the switching matrix system 2 may provide the user interface GUI21 for a user to operate the switching matrix modules 8A to 8D.

Figure 2F:
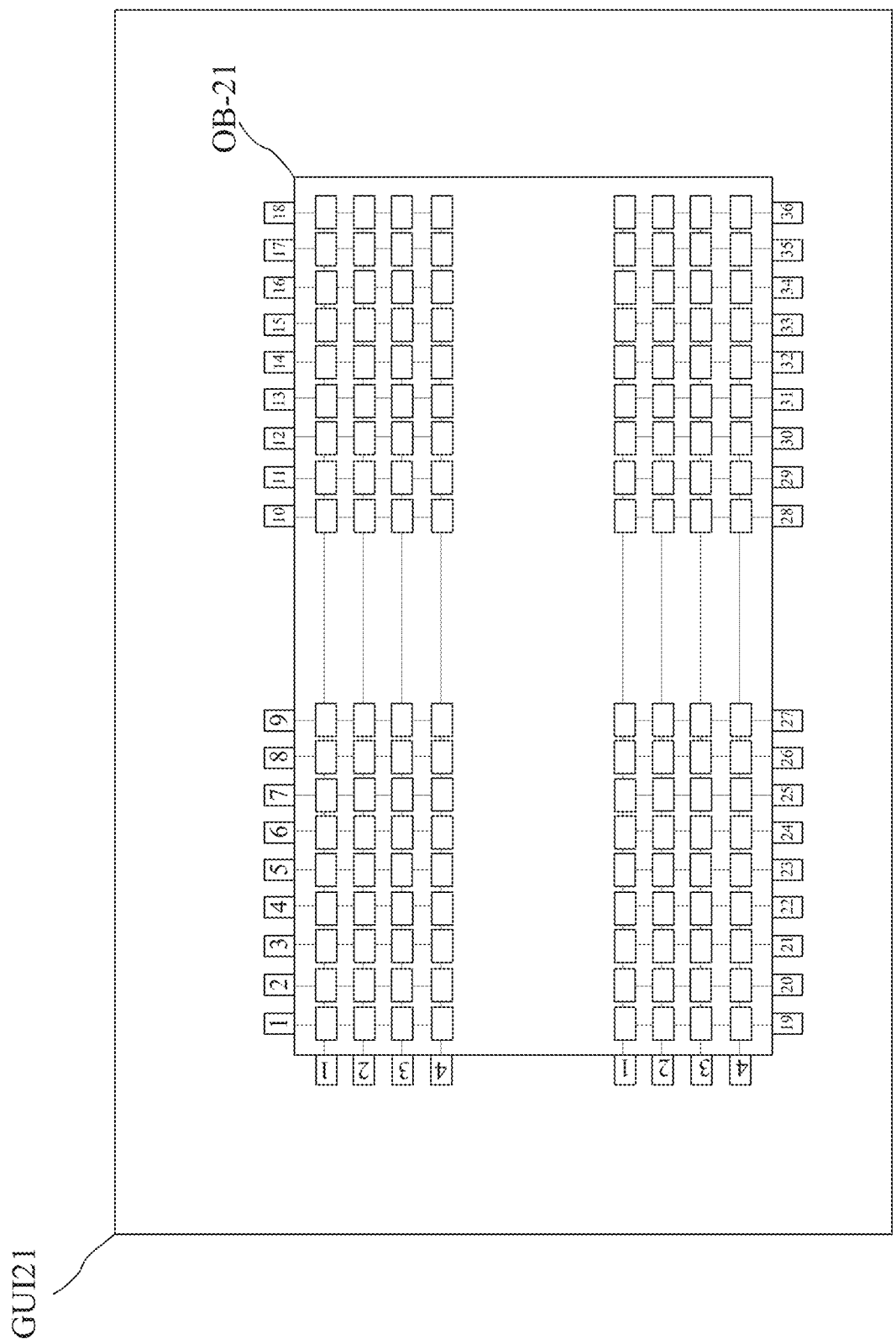
FIG. 2F is a schematic view of a user interface according to some embodiments of the present disclosure.

Please refer to FIG. 2F, which is a schematic view of the user interface GUI21 according to some embodiments of the present disclosure. The user interface GUI21 may include a single object OB-21 corresponding to a combination of the slots 21A to 21D.

Based on the assembly, the slots 21A to 21D respectively receive the switching matrix modules 8A to SD. Accordingly, the object OB-21 of the user interface GUI21 determined by the controller 23 may include a graphic matrix corresponding to physical matrixes of the switching matrix modules 8A to 8D so that the user may operate the graphic matrix of the object OB-21 to control the physical matrixes of the switching matrix modules 8A to SD as one module.

More specifically, elements of the graphic matrix of the object OB-21 may correspond to elements of the physical matrixes of the switching matrix modules 8A to 8D. When the user operates one element of the graphic matrix of the object OB-21, the corresponding element of the physical matrixes of the switching matrix modules 8A to 8D may be controlled accordingly.

For example, when a size of each physical matrix of the switching matrix modules 8A to 8D is 4×9, the object OB-21 of the user interface GUI21 includes the graphic matrix corresponding to physical matrixes of the switching matrix modules 8A to 8D, and a size of the graphic matrix is 4×(9*4), icy which is 4×36.

It should be noted that, when necessary, the 4×36 graphic matrix can be divided into several parts in the object OB-21 of the user interface GUI21 (i.e., an upper part and a lower part of the object OB-21 of the user interface GUI21, as shown in FIG. 2F).

Therefore, when the user operates the element [3, 1] of the graphic matrix of the object OB-21 to be under an open status, the corresponding element [3, 1] of the physical matrix of the switching matrix module 8A is opened accordingly. When the user operates the element [3, 10] of the graphic matrix of the object OB-21 to be under a closing status, the corresponding element [3, (10-9)] (i.e, element [3, 1]) of the physical matrix of the switching matrix module 8B is closed accordingly.

Moreover, when the user operates the element [4, 19] of the graphic matrix of the object OB-21 to be under a closing status, the corresponding element [4, (19-9*2)] (i.e., element [4, 1]) of the physical matrix of the switching matrix module 8C is closed accordingly. When the user operates the element [4, 36] of the graphic matrix of the object OB-21 to be under an open status, the corresponding element [4, (36-9*3)] (i.e., element [4, 9]) of the physical matrix of the switching matrix module 8D is opened accordingly.

Figure 3A:
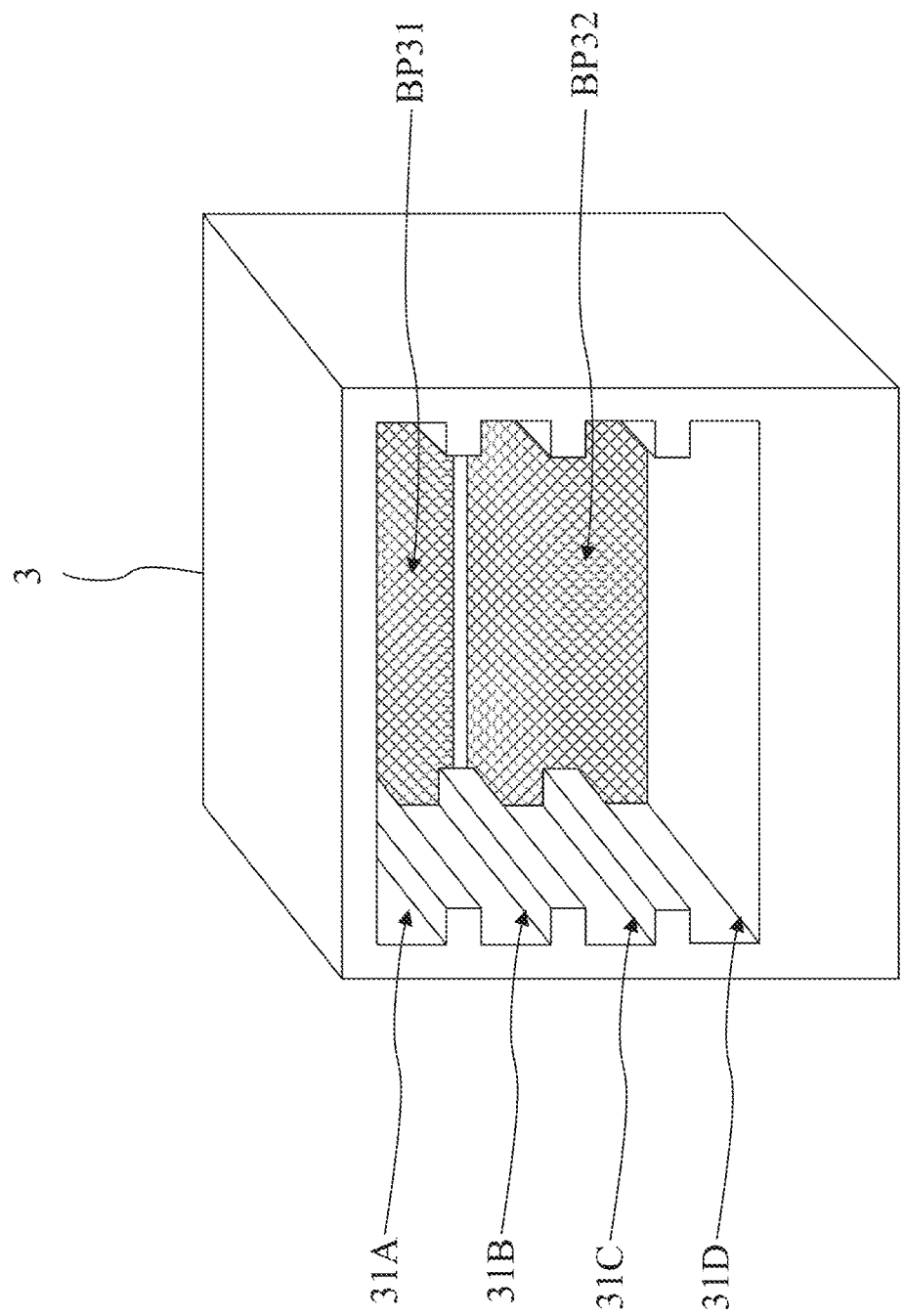
FIG. 3A is a schematic view of a switching matrix system for semiconductor characteristic measurement according to some embodiments of the present disclosure.
Figure 3B:
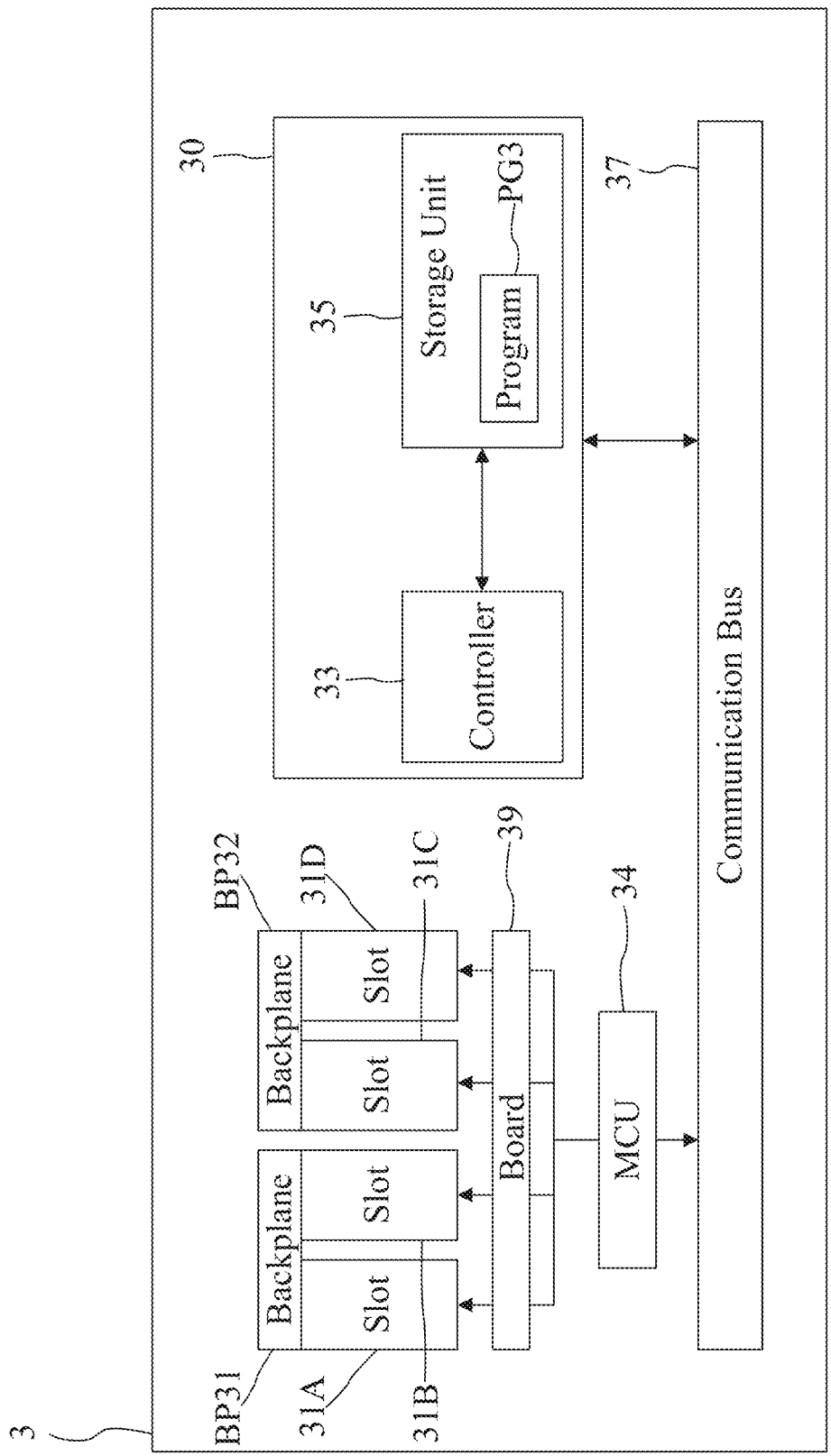
FIG. 3B is a block diagram of a switching matrix system according to some embodiments of the present disclosure.

Please refer to FIGS. 3A and 3B together. FIG. 3A is a schematic view of a switching matrix system 3 for semiconductor characteristic measurement according to some embodiments of the present disclosure. FIG. 3B is a block diagram of the switching matrix system 3 according to some embodiments of the present disclosure.

The switching matrix system 3 may include a computing device 30, a plurality of slots 31A to 31D, a MCU 34, a board 39, a backplane BP31 and a backplane BP32. The computing device 30 may include a controller 33 and a storage unit 35. The controller 33 and the storage unit 35 may be electrically connected through a communication bus (not shown) of the computing device 30.

The slots 31A to 31D may be used for receiving at least one switching matrix module. The slots 31A to 31D and the MCU 34 may be electrically connected by the board 39. The slots 31A and 31B may be integrated by the backplane BP31, and the slots 31C and 31D may be integrated by the backplane BP32.

The computing device 30, the MCU 34, the slots 31A to 31D may be electrically connected through a communication bus 37. The computing device 30 may exchange control signals with the MCU 34 through the communication bus 37 for interacting with the slots 31A to 31D.

The computing device 30 may allow the controller 33 to execute a program PG3 stored in the storage unit 35. The program PG3 may be executed after starting an operating mode of the switching matrix system 3. Further, when executed, the program PG-3 may generate one or more interrupts (e.g., software-interrupts) to cause the controller 33 to perform functions of the program PG3 for operating the switching matrix system 3. The interactions between the switching matrix system 3 and the functions of the program PG3 will be further described below.

Figure 3C:
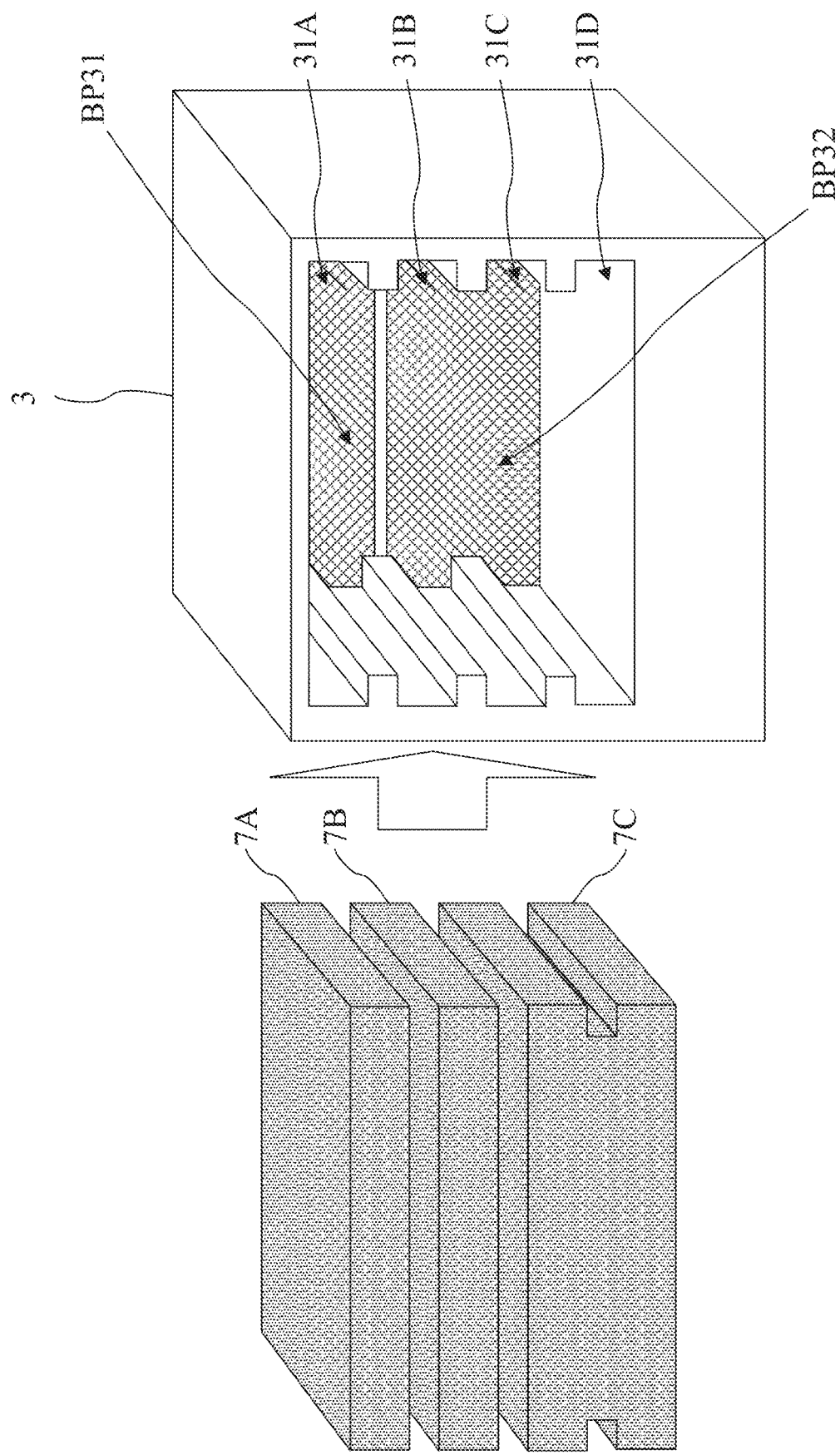
FIG. 3C is a schematic view of a switching matrix module being inserted into a switching matrix system according to some embodiments of the present disclosure.
Figure 3D:
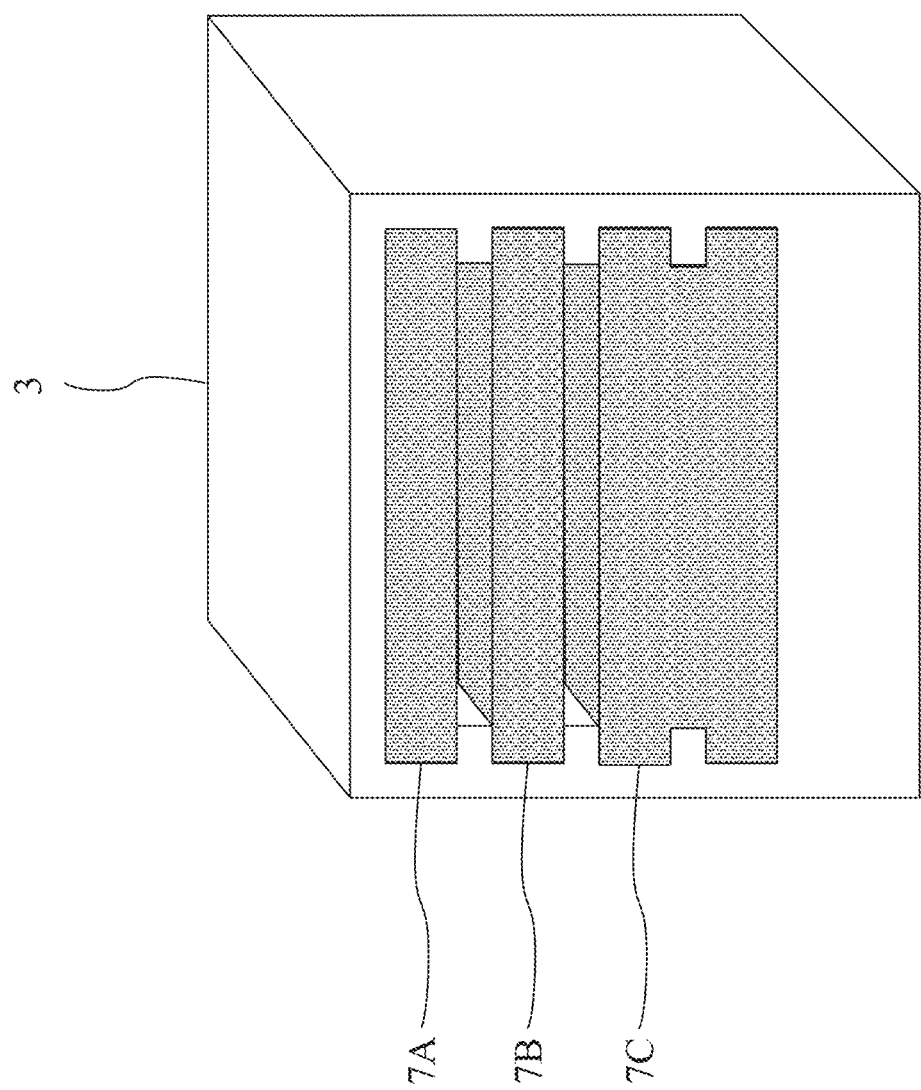
FIG. 3D is a schematic view of an assembly of a switching matrix module and a switching matrix system according to some embodiments of the present disclosure.

Please refer to FIGS. 3C and 3D together. FIG. 3C is a schematic view of switching matrix modules being inserted into the switching matrix system 3 according to some embodiments of the present disclosure. FIG. 3D is a schematic view of an assembly of switching matrix modules and the switching matrix system 3 according to some embodiments of the present disclosure.

In detail, switching matrix modules 7A to 7C may be provided. Each of the switching matrix modules 7A and 7B may have a size that fits one slot of the switching matrix system 3. The switching matrix module 7C may have a size that fits two slots of the switching matrix system 3. Accordingly, each of the switching matrix modules 7A and 7B may be inserted into one slot of the switching matrix system 3, and the switching matrix module 7C may be inserted into two slots of the switching matrix system 3.

In these embodiments, as shown in FIGS. 3C and 3D, the switching matrix modules 7A and 7B may be respectively inserted into the slots 31A and 31B of the switching matrix system 3, and the switching matrix module 7C may be inserted into the slots 31C and 31D of the switching matrix system 3. After being inserted into the slots 31A to 31D of the switching matrix system 3, the switching matrix modules 7A to 7C may be electrically connected to the MCU 34 of the switching matrix system 3.

Next, after the switching matrix system 3 is booted up, the operating system starts. The program PG3 may then be executed to initialize a hardware setting of the switching matrix system 3 and to perform some dongle procedures for security of the switching matrix system 3.

Subsequently, through the MCU 34, the controller 33 may detect an assembly of switching matrix modules inserted into the slots 31A to 31D. Particularly, in such implementations, the controller 33 of the switching matrix system 3 may detect the insertions of the switching matrix modules 7A to 7C. Then, the controller 33 of the switching matrix system 3 may determine the assembly of the switching matrix modules 7A to 7C by a hardware configuration (not shown).

Further, through the MCU 34, the controller 33 of the switching matrix system 3 may determine a switching matrix module type for each of the switching matrix modules 7A to 7C. Each switching matrix module type may include matrix size information (e.g, a number of channels of the matrix) of the corresponding switching matrix module.

In some embodiments, when the backplane BP31 is configured for operating the switching matrix modules 7A and 7B individually, the controller 33 of the switching matrix system 3 may determine a user interface GUI30 according to: (1) the switching matrix module types of the switching matrix modules 7A to 7C; and (2) the assembly of the switching matrix modules 7A to 7C inserted into the slots 31A to 31D. The controller 33 of the switching matrix system 3 may provide the user interface GUI30 for a user to operate the switching matrix modules 7A to 7C.

Figure 3E:
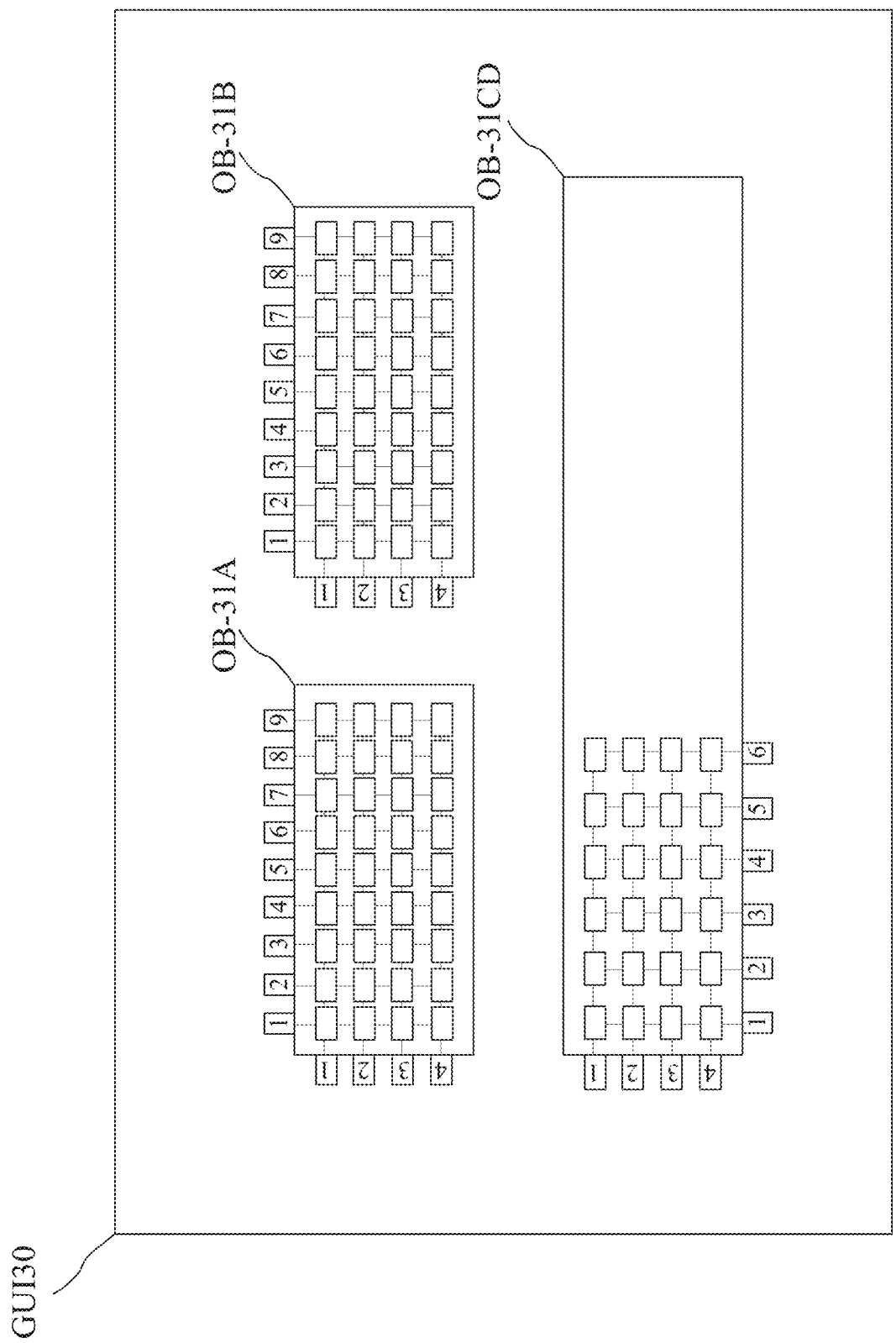
FIG. 3E is a schematic view of a user interface according to some embodiments of the present disclosure.

Please refer to FIG. 3E, which is a schematic view of the user interface GUI30 according to some embodiments of the present disclosure. The user interface GUI30 may include objects OB-31A, OB-31B and OB-31CD corresponding to the slots 31A, 31B and a combination of slots 31C and 31D, respectively.

Based on the assembly, the slots 31A and 31B respectively receive the switching matrix modules 7A and 7B. Accordingly, the objects OB-31A and OB-31B of the user interface GUI30 determined ley the controller 33 may include graphic matrixes corresponding to physical matrixes of the switching matrix modules 7A and 7B, such that the user may operate the graphic matrixes of the objects OB-31A-OB-31B to control the physical matrixes of the switching matrix modules 7A and 7B. In other words, the objects OB-31A and OB-31B may be operable objects of the switching matrix modules 7A and 7B.

More specifically, elements of the graphic matrix of the object OB-31A may correspond to elements of the physical matrix of the switching matrix module 7A. When the user operates one element of the graphic matrix of the object OB-31A, the corresponding element of the physical matrix of the switching matrix module 7A may be controlled accordingly.

Similarly, elements of the graphic matrix of the object OB-31B may correspond to elements of the physical matrix of the switching matrix module 7B. When the user operates one element of the graphic matrix of the object OB-31B, the corresponding element of the physical matrix of the switching matrix module 7B may be controlled accordingly.

For example, when the user operates the element [2, 3] of the graphic matrix of the object OB-31A to be under an open status, the corresponding element [2, 3] of the physical matrix of the switching matrix module 7A is opened accordingly. When the user operates the element [2, 4] of the graphic matrix of the object OB-31B to be under a closing status, the corresponding element [2, 4] of the physical matrix of the switching matrix module 7B is closed accordingly.

Further, based on the assembly, the slots 31C and 31D receive the switching matrix module 7C. Accordingly, the object OB-31CD of the user interface GUI30 determined by the controller 33 may include a matrix of the switching matrix module 7C, such that the user can operate the switching matrix module 7C in other words, the object OB-31CD may be an operable object of the switching matrix module 7C.

More specifically, elements of the graphic matrix of the object OB-31CD may correspond to elements of the physical matrix of the switching matrix module 7C. When the user operates one element of the graphic matrix of the object OB-31CD, the corresponding element of the physical matrix of the switching matrix module 7C may be controlled accordingly.

For example, when the user operates the element [3, 5] of the graphic matrix of the object OB-31CD to be under an open status, the corresponding element [3, 5] of the physical matrix of the switching matrix module 7C is opened accordingly. When the user operates the element [3, 4] of the graphic matrix of the object OB-31CD to be under a closing status, the corresponding element [3, 4] of the physical matrix of the switching matrix module 7C is closed accordingly.

In some embodiments, when the backplane BP31 is configured for operating the switching matrix modules 7A and 7B as one module, the controller 33 of the switching matrix system 3 may determine a user interface GUI31 according to: (1) the switching matrix module types of the switching matrix modules 7A to 7C; and (2) the assembly of the switching matrix modules 7A to 7C inserted into the slots 31A to 31D. The controller 33 of the switching matrix system 3 may provide the user interface GUI31 for a user to operate the switching matrix modules 7A to 7C.

Figure 3F:
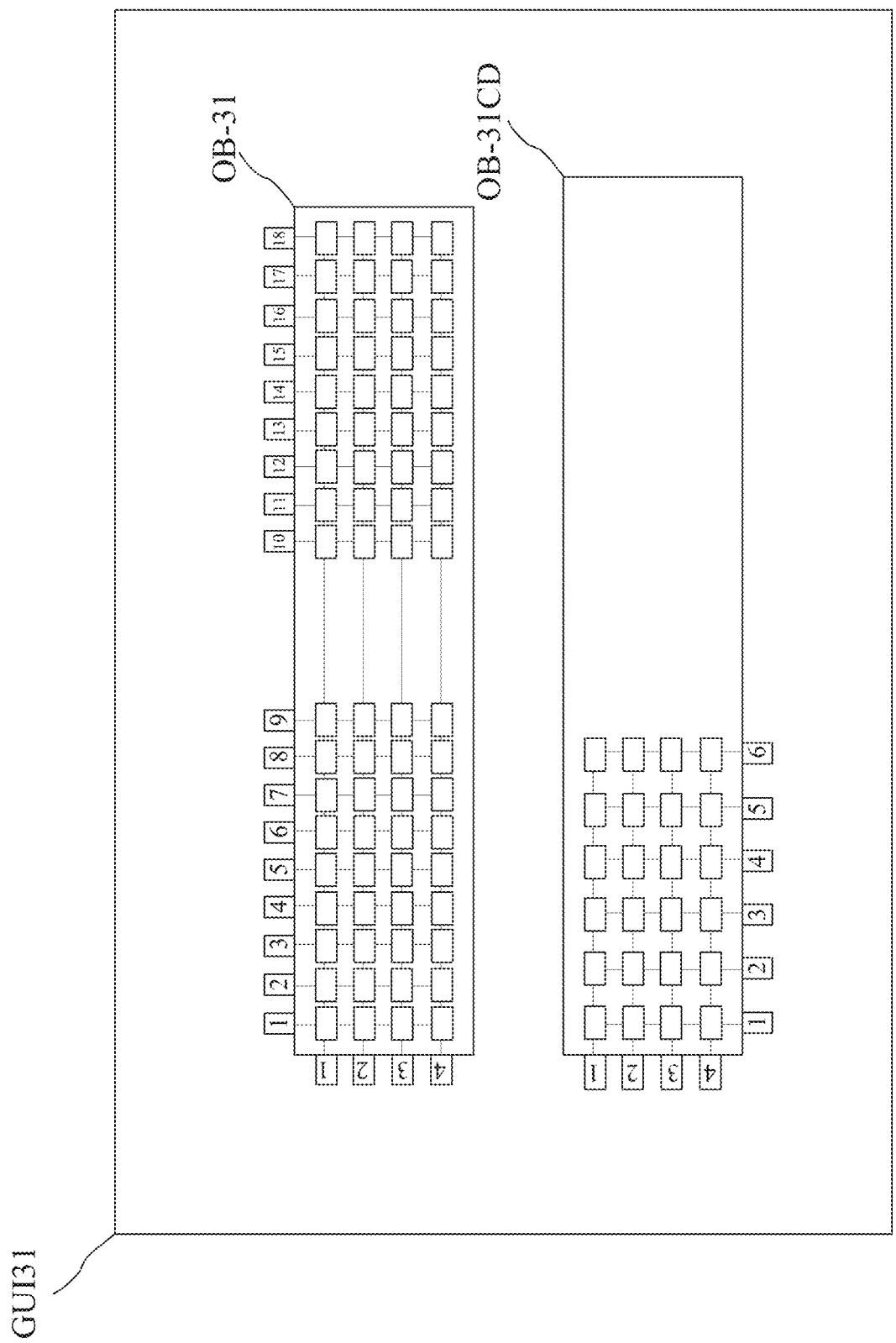
FIG. 3F is a schematic view of a user interface according to some embodiments of the present disclosure.

Please refer to FIG. 3F, which is a schematic view of the user interface GUI31 according to some embodiments of the present disclosure. The user interface GUI31 may include: (1) a single object OB-31 corresponding to a combination of the slots 31A and 31B; and (2) a single object OB-31CD corresponding to a combination of the slots 31C and 31D.

Based on the assembly, the slots 31A and 31B respectively receive the switching matrix modules 7A and 7B. Accordingly, the object OB-31 of the user interface GUI31 determined by the controller 33 may include a graphic matrix corresponding to physical matrixes of the switching matrix modules 7A and 7B such that the user can operate the graphic matrix of the object OB-31 to control the physical matrixes of the switching matrix modules 7A and 7B as one module.

More specifically, elements of the graphic matrix of the object OB-31 may correspond to elements of the physical matrixes of the switching matrix modules 7A and 7B. When the user operates one element of the graphic matrix of the object OB-31, the corresponding element of the physical matrixes of the switching matrix modules 7A and 7B may be controlled accordingly.

For example, when a size of each physical matrix of the switching matrix modules 7A and 7B is 4×9, the object OB 31 of the user interface GUI31 includes the graphic matrix corresponding to physical matrixes of the switching matrix modules 7A and 7B, and a size of the graphic matrix is 4×(9*2), which is 4×18.

Therefore, when the user operates the element [19] of the graphic matrix of the object OB-31 to be under an open status, the corresponding element [1, 9] of the physical matrix of the switching matrix module 7A is opened accordingly. When the user operates the element [1, 10] of the graphic matrix of the object OB-31 to be under a closing status, the corresponding element [1, (10-9)] (i.e., element [1, 1]) of the physical matrix of the switching matrix module 7B is closed accordingly.

Further, based on the assembly, the slots 31C and 31D receive the switching matrix module 7C. Accordingly, the object OB-31CD of the user interface GUI31 determined by the controller 33 may include a graphic matrix corresponding to a physical matrix of the switching matrix module 7C so that the user may operate the graphic matrix of the object OB-31CD to control the physical matrix of the switching matrix module 7C. In other words, the object OB-31CD may be an operable object of the switching matrix module 7C.

More specifically, elements of the graphic matrix of the object OB-31CD may correspond to elements of the physical matrix of the switching matrix module 7C. When the user operates one element of the graphic matrix of the object OB-31CD, the corresponding element of the physical matrix of the switching matrix module 7C may be controlled accordingly.

For example, when the user operates the element [2, 1] of the graphic matrix of the object OB-31CD to be under an open status, the corresponding element [2, 1] of the physical matrix of the switching matrix module 7C is opened accordingly. When the user operates the element [4, 6] of the graphic matrix of the object OB-31CD to be under a closing status, the corresponding element [4, 6] of the physical matrix of the switching matrix module 7C is closed accordingly.

Figure 3G:
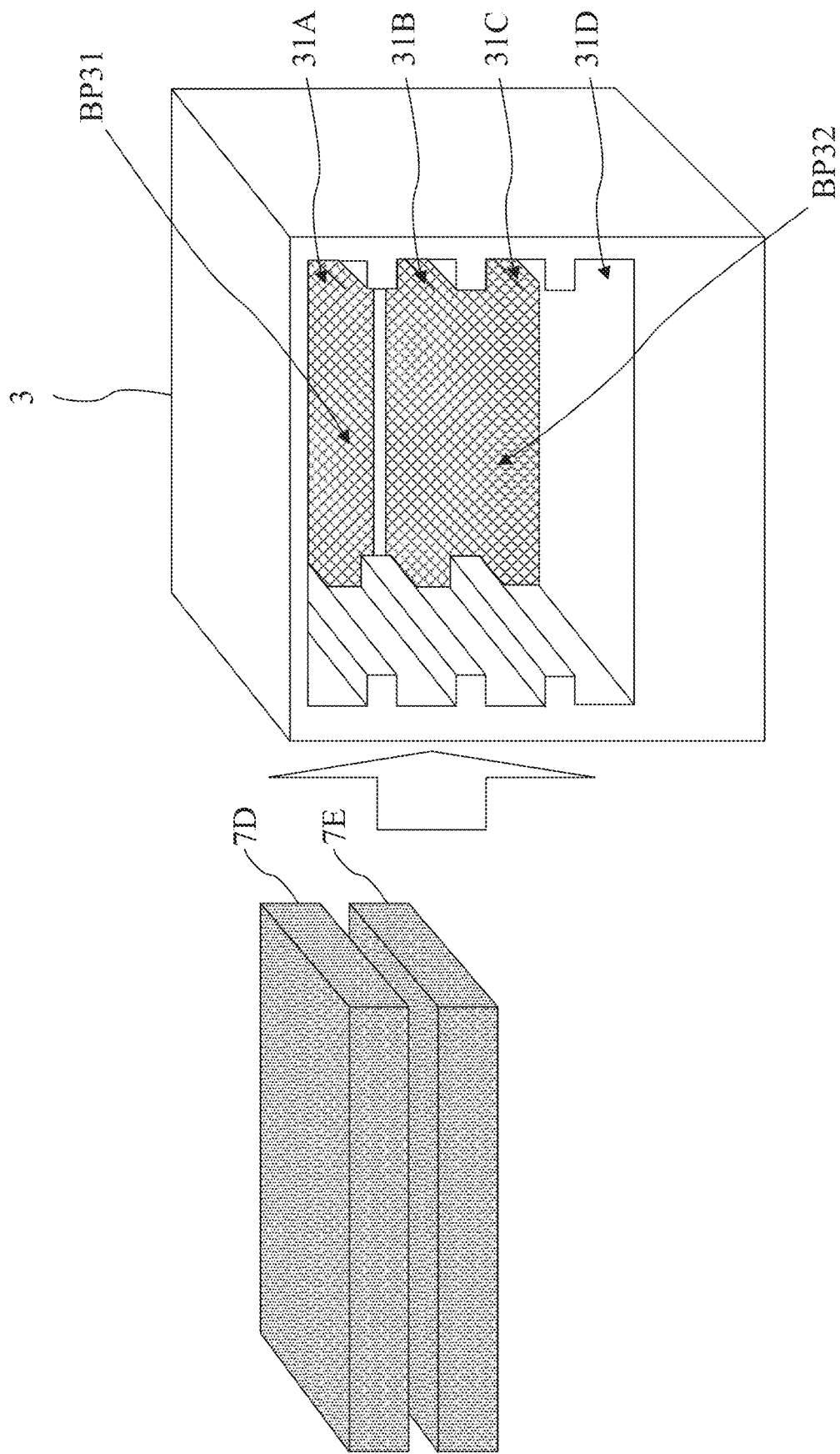
FIG. 3G is a schematic view of a switching matrix module being inserted into a switching matrix system according to some embodiments of the present disclosure.
Figure 3H:
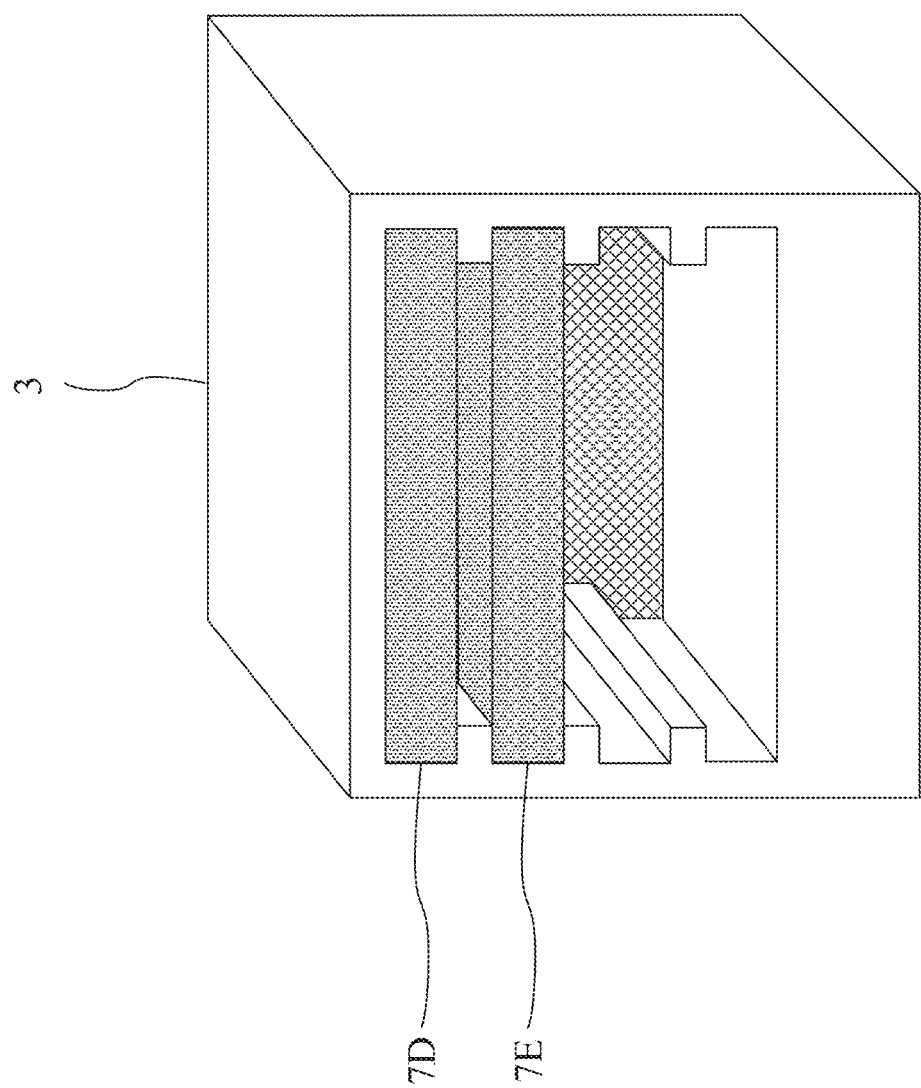
FIG. 3H is a schematic view of an assembly of a switching matrix module and a switching matrix system according to some embodiments of the present disclosure.

Please refer to FIGS. 3G and 3H together. FIG. 3G is a schematic view of switching matrix modules being inserted into the switching matrix system 3 according to some embodiments of the present disclosure. FIG. 3H is a schematic view of an assembly of switching matrix modules and the switching matrix system 3 according to some embodiments of the present disclosure.

In detail, switching matrix modules 7D and 7E may be provided. Each of the switching matrix modules 7D and 7E may have a size that fits one slot of the switching matrix system 3. Accordingly, each of the switching matrix modules 7A and 7B may be inserted into one slot of the switching matrix system 3.

In these embodiments, as shown in FIGS. 3G and 3H, the switching matrix modules 7D and 7E may be respectively inserted into the slots 31A and 31B of the switching matrix system 3. After being inserted into the slots 31A and 31B of the switching matrix system 3, the switching matrix modules 7D and 7E may be electrically connected to the MCU 34 of the switching matrix system 3.

Next, after the switching matrix system 3 is booted up, the operating system starts. The program PG3 may then be executed to initialize a hardware setting of the switching matrix system 3 and to perform some dongle procedures for security of the switching matrix system 3.

Subsequently, through the MCU 34, the controller 33 may detect an assembly of switching matrix modules inserted into the slots 31A to 31D. Particularly, in such implementations, the controller 33 of the switching matrix system 3 may detect the insertions of the switching matrix modules 7D and 7E. Then, the controller 33 of the switching matrix system 3 may determine the assembly of the switching matrix modules 7D and 7E by the hardware configuration.

Further, through the MCU 34, the controller 33 of the switching matrix system 3 may determine a switching matrix module type for each of the switching matrix modules 7D and 7E. Each switching matrix module type may include matrix size information (e.g., a number of channels of the matrix) of the corresponding switching matrix module.

In some embodiments, when the backplane BP31 is configured for operating the switching matrix modules 7D and 7E individually, the controller 33 of the switching matrix system 3 its may determine a user interface GUI32 according to: (1) the switching matrix module types of the switching matrix modules 7D and 7E; and (2) the assembly of the switching matrix modules 7D and 7E inserted into the slots 31A and 31B. The controller 33 of the switching matrix system 3 may provide the user interface GUI32 for a user to operate the switching matrix modules 7D and 7E.

Figure 3I:
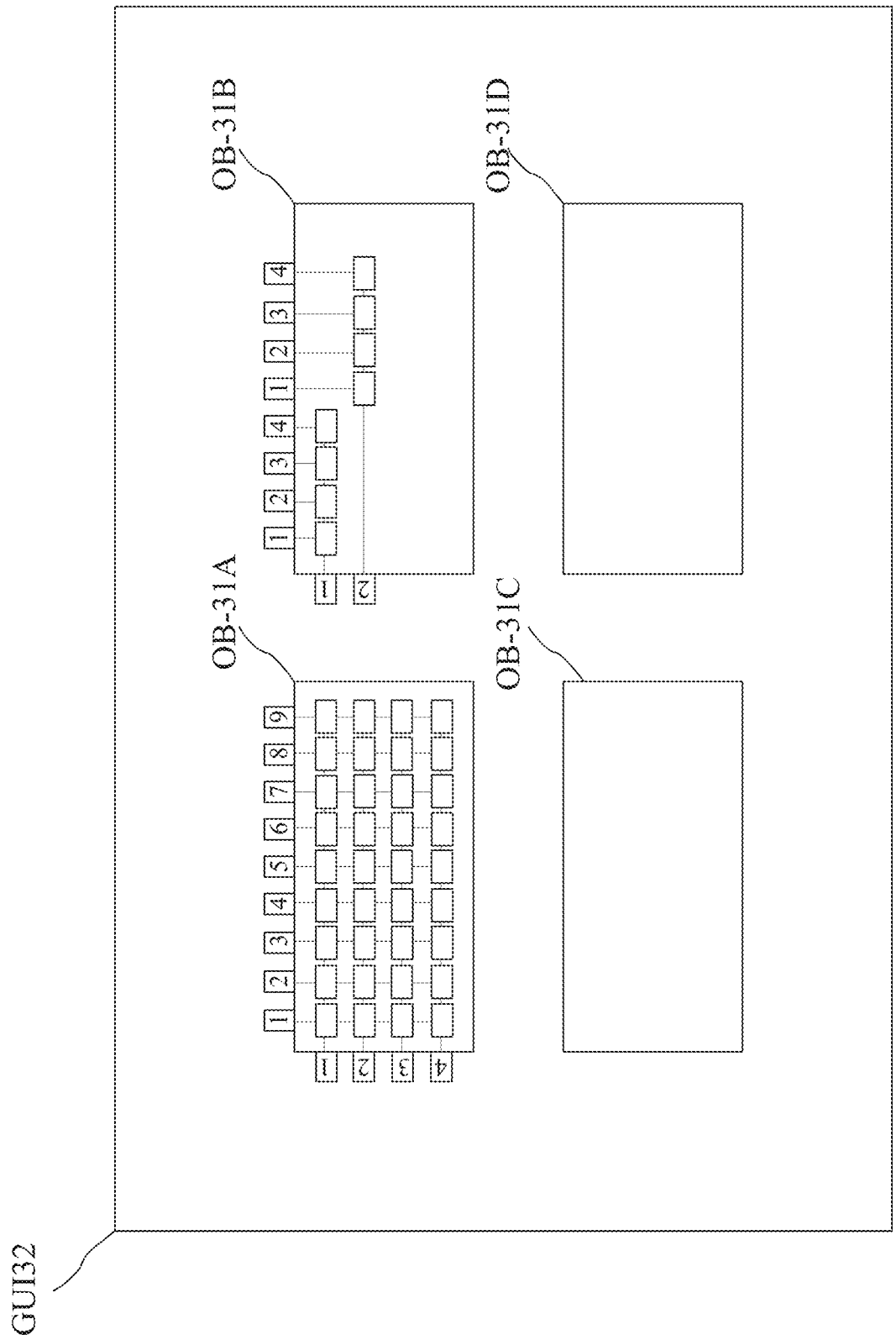
FIG. 3I is a schematic view of a user interface according to some embodiments of the present disclosure.

Please refer to FIG. 3I, which is a schematic view of the user interface GUI32 according to some embodiments of the present disclosure. The user interface GUI32 may include objects OB-31A, OB-31B, OB-31C and OB-31D corresponding to the slots 31A to 31D, respectively.

Based on the assembly, the slots 31A, and 31B respectively receive the switching matrix modules 7D and 7E. Accordingly, the objects OB-31A and OB-31B of the user interface GUI32 determined by the controller 33 may include graphic matrixes corresponding to physical matrixes of the switching matrix modules 7D and 7E, such that the user may operate the graphic matrixes of the objects OB-31A and OB-31B to control the physical matrixes of the switching matrix modules 7D and 7E. In other words, the objects OB-31A and OB-31B may be operable objects of the switching matrix modules 7D and 7E.

More specifically, elements of the graphic matrix of the object OB-31A may correspond to elements of the physical matrix of the switching matrix module 7D. When the user operates one element of the graphic matrix of the object OB-31A, the corresponding element of the physical matrix of the switching matrix module 7D may be controlled accordingly.

For example, when the user operates the element [3, 6] of the graphic matrix of the object OB-31A to be under an open status, the corresponding element [3, 6] of the physical matrix of the switching matrix module 7D is opened accordingly.

Similarly, elements of the graphic matrix of the object OB-31B may correspond to elements of the physical matrix of the switching matrix module 7E. When the user operates one element of the graphic matrix of the object OB-31B, the corresponding element of the physical matrix of the switching matrix module 7E may be controlled accordingly.

In some implementations, elements of the physical matrix of the switching matrix module 7E may not be all conducted. For example, when a physical matrix of the switching matrix module 7E is 2×4 and elements [1, 1 to 4] of this physical matrix are not conducted to elements [2, 1 to 4] of this physical matrix, the elements [1, 1 to 4] of the graphic matrix of the object OB-31B is separated from the elements [2, 1 to 4] of the graphic matrix of the object OB-31B as shown in FIG. 3I.

When the user operates the element [1, 3] of the graphic matrix of the object OB-31B to be under a closing status, the corresponding element [1, 3] of the physical matrix of the switching matrix module 7E is closed accordingly.

On the other hand, because the slot 31C and 31D do not receive any switching matrix module (i.e., the slot 31C and 31D are non-occupied), the corresponding objects OB-31C and OB-31D may be blank, as shown in FIG. 3I.

It should be noted that the above switching matrix system may further include a display (not shown) for displaying the user interfaces. In other words, the controller of the switching matrix system may provide user interfaces on the display. Further, the display may include a touch panel or connect to a keyboard, a mouse or a joystick (not shown) for user to operate the objects of the user interfaces.

It should be noted that the above switching matrix system may further include a General Purpose Interface Bus interface (GPIB I/F, not shown). The GPIB I/F may be electrically connected to the controller/MCU of the switching matrix system. The switching matrix system may be remotely controlled by a remote device through a connection between the remote device and the CPIB I/F of the switching matrix system.

It should be noted that each of the above switching matrix modules used for measuring semiconductor characteristic may include a MCU and a switching matrix. The switching matrix may include a plurality of input ports, a plurality of output ports, a plurality of switching devices configured to open and close, an electrical connection between the input ports and the output ports, and an electrical sensor configured to generate a signal by measuring a predetermined electrical property of the electrical connection. The opening and closing of switching devices may be predetermined based on a status read from the electrical sensor. The MCU may be configured to control on/off states of the switching devices.

It shall be particularly appreciated that the controller or the MCU of the switching matrix system mentioned in the above embodiments may include a central processing unit (CPU), other hardware circuit elements capable of executing relevant instructions, or a combination of computing circuits that are well known to those skilled in the art based on the above disclosures.

Moreover, the storage unit mentioned in the above embodiments may include memories, such as ROM, RAM, etc., or storage devices, such as flash memory, HDD, SSD, etc., for storing data. Further, the communication buses mentioned in the above embodiments may include a communication interface for transferring data between the elements, such as the slots, the controller and the storage unit, and may include an electrical bus interface, an optical bus interface or even a wireless bus interface. However, such description is not intended to limit the hardware implementation embodiments of the present disclosure.

Figure 4:
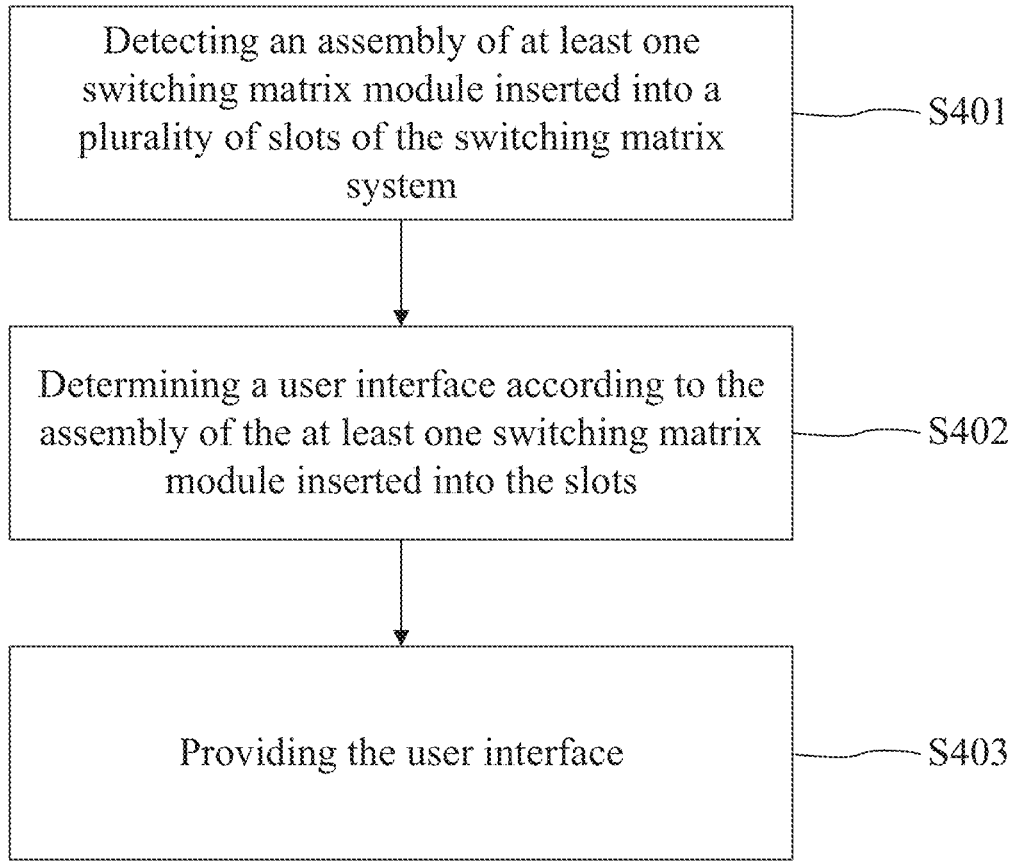
FIG. 4 is a flow diagram of an operating method according to some embodiments of the present disclosure.

FIG. 4 is a flowchart diagram of an operating method according to some embodiments of the present disclosure. The operating method according to some embodiments is for use in a switching matrix system (e.g., the switching matrix systems of the embodiments described above). Detailed steps of the operating method are described below.

Operation S401 is executed to detect, by the switching matrix system, an assembly of at least one switching matrix module inserted into a plurality of slots of the switching matrix system. Operation S402 is executed to determine, by the switching matrix system, a user interface according to the assembly of the at least one switching matrix module inserted into the slots. The user interface may include an operable object corresponding to the assembly. Operation S403 is executed to provide, by the switching matrix system, the user interface for a user to operate the at least one switching matrix module.

Figure 5:
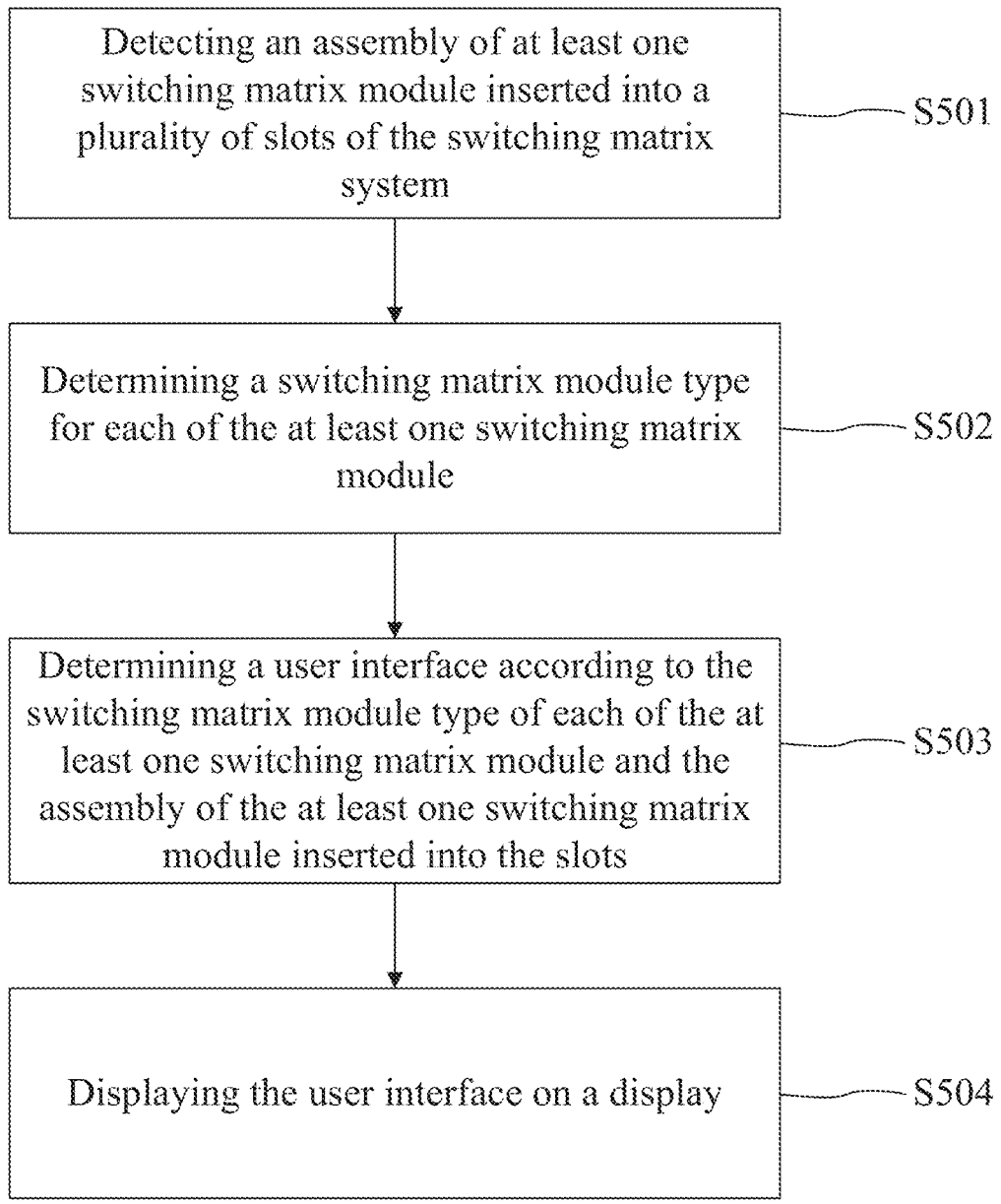
FIG. 5 is a flow diagram of an operating method according to some embodiments of the present disclosure.

FIG. 5 is a flowchart diagram of an operating method according to some embodiments of the present disclosure. The operating method according to some embodiments is for use in a switching matrix system (e.g., the switching matrix systems of the embodiments described above). Detailed steps of the operating method are described below.

Operation S501 is executed to detect, by the switching matrix system, an assembly of at least one switching matrix module inserted into a plurality of slots of the switching matrix system. Operation S502 is executed to determine, by the switching matrix system, a switching matrix module type for each of the at least one switching matrix module.

Operation S503 is executed to determine, by the switching matrix system, a user interface according to the switching matrix module type of each of the at least one switching matrix module and the assembly of the at least one switching matrix module inserted into the slots. Operation S504 is executed to display, by the switching matrix system, the user interface on a display for a user to operate the at least one switching matrix module.

In some implementations, the at least one switching matrix module may include a plurality of switching matrix modules. The at least one operable object may include one operable object corresponding to the switching matrix modules.

In some implementations, the at least one switching matrix module may include a plurality of switching matrix modules. The at least one operable object may include a plurality of operable objects corresponding to the switching matrix modules, respectively.

In some implementations, the at least one switching matrix module may include a plurality of switching matrix modules. The at least one operable object may include: (I) a first operable object corresponding to a first portion of the switching matrix modules; and (2) a second operable object corresponding to a second portion of the switching matrix modules.

In some implementations, the at least one switching matrix module may include a plurality of switching matrix nodules. The at least one operable object may include: (1) a first operable object corresponding to a first portion of the switching matrix modules; and (2) a plurality of second operable objects corresponding to a second portion of the switching matrix nodules.

In some implementations, the at least one switching matrix module may include a plurality of switching matrix modules. The at least one operable object may include: (1) a plurality of first operable objects corresponding to a first portion of the switching matrix modules, respectively; and (2) a plurality of second operable objects corresponding to a second portion of the switching matrix modules, respectively.

Although the present disclosure and its advantages have been described in detail; it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary, skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A switching matrix system for semiconductor characteristic measurement, comprising:
a plurality of slots configured for receiving at least one switching matrix module;
a controller, electrically connected to the slots; and
a storage unit, electrically connected to the controller for storing a program that, when executed, causes the controller to:
detect an assembly of the at least one switching matrix module inserted into the slots;
determine a user interface according to the assembly of the at least one switching matrix module inserted into the slots, wherein the user interface includes at least one operable object corresponding to the assembly; and
provide the user interface.

2. The switching matrix system of claim 1, further comprising:
a board for connecting the slots and the controller.

3. The switching matrix system of claim 1, wherein the program, when executed, further causes the controller to:
determine a switching matrix module type for each of the at least one switching matrix module;
wherein determining the user interface further comprises:
determining the user interface according to the switching matrix module type of each of the at least one switching matrix module and the assembly of the at least one switching matrix module inserted into the slots.

4. The switching matrix system of claim 1, wherein the at least one switching matrix module includes a plurality of switching matrix modules, and the switching matrix system further comprises:
a backplane for connecting the switching matrix modules.

5. The switching matrix system of claim 4, wherein the at least one operable object includes one operable object corresponding to the switching matrix modules.

6. The switching matrix system of claim 4, wherein the at least one operable object includes a plurality of operable objects corresponding to the switching matrix modules, respectively.

7. The switching matrix system of claim 1, wherein the at least one switching matrix module includes a plurality of switching matrix modules, and the switching matrix system further comprises:
a first backplane for connecting a first portion of the switching matrix modules; and
a second backplane for connecting a second portion of the switching matrix modules.

8. The switching matrix system of claim 7, wherein the at least one operable object includes:
a first operable object corresponding to the first portion of the switching matrix modules; and
a second operable object corresponding to the second portion of the switching matrix modules.

9. The switching matrix system of claim 7, wherein the at least one operable object includes:
a first operable object corresponding to the first portion of the switching matrix modules; and
a plurality of second operable objects corresponding to the second portion of the switching matrix modules, respectively.

10. The switching matrix system of claim 7, wherein the at least one operable object includes:
a plurality of first operable objects corresponding to the first portion of the switching matrix modules, respectively; and
a plurality of second operable objects corresponding to the second portion of the switching matrix modules, respectively.

11. The switching matrix system of claim 1, further comprising:
a display for displaying the user interface.

12. The switching matrix system of claim 11, wherein the display includes a touch panel for operating the at least one operable object of the user interface.

13. An operating method of a switching matrix system, comprising:
detecting, by the switching matrix system, an assembly of at least one switching matrix module inserted into a plurality of slots of the switching matrix system;
determining, by the switching matrix system, a user interface according to the assembly of the at least one switching matrix module inserted into the slots, wherein the user interface includes an operable object corresponding to the assembly; and
providing, by the switching matrix system, the user interface.

14. The operating method of claim 13, further comprising:
determining, by the switching matrix system, a switching matrix module type for each of the at least one switching matrix module;
wherein determining the user interface further comprises:
determining, by the switching matrix system, the user interface according to the switching matrix module type of each of the at least one switching matrix module and the assembly of the at least one switching matrix module inserted into the slots.

15. The operating method of claim 13, wherein the at least one switching matrix module includes a plurality of switching matrix modules, and the at least one operable object includes one operable object corresponding to the switching matrix modules.

16. The operating method of claim 13, wherein the at least one switching matrix module includes a plurality of switching matrix modules, and the at least one operable object includes a plurality of operable objects corresponding to the switching matrix modules, respectively.

17. The operating method of claim 13, wherein the at least one switching matrix module includes a plurality of switching matrix modules, and the at least one operable object includes:
a first operable object corresponding to a first portion of the switching matrix modules; and
a second operable object corresponding to a second portion of the switching matrix modules.

18. The operating method of claim 13, wherein the at least one switching matrix module includes a plurality of switching matrix modules, and the at least one operable object includes:
a first operable object corresponding to a first portion of the switching matrix modules; and
a plurality of second operable objects corresponding to a second portion of the switching matrix modules.

19. The operating method of claim 13, wherein the at least one switching matrix module includes a plurality of switching matrix modules, and the at least one operable object includes:
a plurality of first operable objects corresponding to a first portion of the switching matrix modules, respectively; and
a plurality of second operable objects corresponding to a second portion of the switching matrix modules, respectively.

20. The operating method of claim 13, wherein providing the user interface further comprises:
displaying, by the switching matrix system, the user interface on a display.

* * * * *